(12) United States Patent
Forbes

(10) Patent No.: US 7,443,715 B2
(45) Date of Patent: Oct. 28, 2008

(54) SRAM CELLS WITH REPRESSED FLOATING GATE MEMORY, LOW TUNNEL BARRIER INTERPOLY INSULATORS

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 40 days.

(21) Appl. No.: 11/062,543

(22) Filed: Feb. 22, 2005

(65) Prior Publication Data

US 2005/0169054 A1 Aug. 4, 2005

Related U.S. Application Data

(62) Division of application No. 09/945,554, filed on Aug. 30, 2001, now Pat. No. 6,963,103.

(51) Int. Cl.
*G11C 11/00* (2006.01)
(52) U.S. Cl. .................. 365/154; 365/155; 365/156
(58) Field of Classification Search .......... 365/154, 365/155, 156; 257/315
See application file for complete search history.

(56) References Cited

U.S. PATENT DOCUMENTS

| | | |
|---|---|---|
| 4,295,150 A | 10/1981 | Adam |
| 4,412,902 A | 11/1983 | Michikami et al. |
| 4,510,584 A | 4/1985 | Dias et al. |
| 4,545,035 A | 10/1985 | Guterman et al. |
| 4,556,975 A | 12/1985 | Smith et al. |
| 4,665,417 A | 5/1987 | Lam |
| 4,672,240 A | 6/1987 | Smith et al. |
| 4,688,078 A | 8/1987 | Hseih |
| 4,757,360 A | 7/1988 | Faraone et al. |
| 4,780,424 A | 10/1988 | Holler |
| 4,939,559 A | 7/1990 | DiMaria et al. |
| 5,042,011 A | 8/1991 | Casper et al. |
| 5,057,448 A | 10/1991 | Kuroda |
| 5,071,782 A | 12/1991 | Mori |
| 5,073,519 A | 12/1991 | Rodder |
| 5,153,880 A | 10/1992 | Owen et al. |
| 5,280,205 A | 1/1994 | Green et al. |
| 5,315,142 A | 5/1994 | Acovic et al. |

(Continued)

OTHER PUBLICATIONS

Aarik, Jaan, et al., "Anomalous effect of temperature on atomic layer deposition of titanium dioxide", *Journal of Crystal Growth*, 220(4), (Dec. 2000), 531-537.

(Continued)

*Primary Examiner*—Pho M. Luu
(74) *Attorney, Agent, or Firm*—Schwegman, Lundberg & Woessner, P.A.

(57) ABSTRACT

Structures and methods are provided for SRAM cells having a novel, non-volatile floating gate transistor, e.g. a non-volatile memory component, within the cell which can be programmed to provide the SRAM cell with a definitive asymmetry so that the cell always starts in a particular state. The SRAM cells include a pair of cross coupled transistors. At least one of the cross coupled transistors includes a first source/drain region and a second source/drain region separated by a channel region in a substrate. A floating gate opposes the channel region and separated therefrom by a gate oxide. A control gate opposes the floating gate. The control gate is separated from the floating gate by a low tunnel barrier intergate insulator.

39 Claims, 12 Drawing Sheets

U.S. PATENT DOCUMENTS

| | | | |
|---|---|---|---|
| 5,331,188 A | 7/1994 | Acovic et al. |
| 5,338,953 A | 8/1994 | Wake |
| 5,350,738 A | 9/1994 | Hase et al. |
| 5,353,431 A | 10/1994 | Doyle et al. |
| 5,399,516 A | 3/1995 | Bergendahl et al. |
| 5,418,389 A | 5/1995 | Watanabe |
| 5,429,966 A | 7/1995 | Wu et al. |
| 5,474,947 A | 12/1995 | Chang et al. |
| 5,488,612 A | 1/1996 | Heybruck |
| 5,497,494 A | 3/1996 | Combs et al. |
| 5,498,558 A | 3/1996 | Kapoor |
| 5,508,544 A | 4/1996 | Shah |
| 5,576,567 A | 11/1996 | Mori |
| 5,600,592 A | 2/1997 | Atsumi et al. |
| 5,608,670 A | 3/1997 | Akaogi et al. |
| 5,618,575 A | 4/1997 | Peter |
| 5,618,761 A | 4/1997 | Eguchi et al. |
| 5,619,051 A | 4/1997 | Endo |
| 5,619,642 A | 4/1997 | Nielsen et al. |
| 5,627,785 A | 5/1997 | Gilliam et al. |
| 5,677,867 A | 10/1997 | Hazani |
| 5,691,230 A | 11/1997 | Forbes |
| 5,703,387 A | 12/1997 | Hong |
| 5,705,415 A | 1/1998 | Orlowski et al. |
| 5,739,567 A | 4/1998 | Wong |
| 5,751,038 A | 5/1998 | Mukherjee |
| 5,768,192 A | 6/1998 | Eitan |
| 5,798,548 A | 8/1998 | Fujiwara |
| 5,801,401 A | 9/1998 | Forbes |
| 5,808,943 A | 9/1998 | Sato et al. |
| 5,852,306 A | 12/1998 | Forbes |
| 5,880,991 A | 3/1999 | Hsu et al. |
| 5,923,056 A | 7/1999 | Lee et al. |
| 5,936,274 A | 8/1999 | Forbes et al. |
| 5,952,692 A | 9/1999 | Nakazato et al. |
| 5,959,465 A | 9/1999 | Beat |
| 5,969,383 A | 10/1999 | Chang et al. |
| 5,973,355 A | 10/1999 | Shirai et al. |
| 5,981,350 A | 11/1999 | Geusic et al. |
| 5,986,932 A | 11/1999 | Ratnakumar et al. |
| 5,991,225 A | 11/1999 | Forbes et al. |
| 6,009,011 A | 12/1999 | Yamauchi |
| 6,025,228 A | 2/2000 | Ibok et al. |
| 6,025,627 A | 2/2000 | Forbes et al. |
| 6,031,263 A | 2/2000 | Forbes et al. |
| 6,069,380 A | 5/2000 | Chou et al. |
| 6,069,816 A | 5/2000 | Nishimura |
| 6,087,222 A | 7/2000 | Jung Lin et al. |
| 6,087,695 A | 7/2000 | Chen |
| 6,091,626 A * | 7/2000 | Madan .................. 365/154 |
| 6,093,606 A | 7/2000 | Lin et al. |
| 6,108,240 A | 8/2000 | Lavi et al. |
| 6,118,147 A | 9/2000 | Liu |
| 6,118,159 A | 9/2000 | Willer et al. |
| 6,124,608 A | 9/2000 | Liu et al. |
| 6,124,729 A | 9/2000 | Noble et al. |
| 6,130,453 A | 10/2000 | Mei et al. |
| 6,134,175 A | 10/2000 | Forbes et al. |
| 6,135,175 A | 10/2000 | Gaudreault et al. |
| 6,141,238 A | 10/2000 | Forbes et al. |
| 6,141,248 A | 10/2000 | Forbes et al. |
| 6,143,636 A | 11/2000 | Forbes et al. |
| 6,147,378 A | 11/2000 | Liu et al. |
| 6,157,061 A | 12/2000 | Kawata |
| 6,163,049 A | 12/2000 | Bui |
| 6,169,306 B1 | 1/2001 | Gardner et al. |
| 6,180,461 B1 | 1/2001 | Ogura |
| 6,180,980 B1 | 1/2001 | Wang |
| 6,191,459 B1 | 2/2001 | Hofmann et al. |
| 6,204,529 B1 | 3/2001 | Lung et al. |
| 6,208,164 B1 | 3/2001 | Noble et al. |
| 6,210,999 B1 | 4/2001 | Gardner et al. |
| 6,229,175 B1 | 5/2001 | Uchida |
| 6,238,976 B1 | 5/2001 | Noble et al. |
| 6,246,606 B1 | 6/2001 | Forbes et al. |
| 6,249,020 B1 | 6/2001 | Forbes et al. |
| 6,249,460 B1 | 6/2001 | Forbes et al. |
| 6,307,775 B1 | 10/2001 | Forbes et al. |
| 6,316,298 B1 | 11/2001 | Lee |
| 6,317,364 B1 | 11/2001 | Guterman et al. |
| 6,323,844 B1 | 11/2001 | Yeh et al. |
| 6,335,554 B1 | 1/2002 | Yoshikawa |
| 6,341,084 B2 | 1/2002 | Numata et al. |
| 6,351,411 B2 | 2/2002 | Forbes et al. |
| 6,376,312 B1 | 4/2002 | Yu |
| 6,377,070 B1 | 4/2002 | Forbes |
| 6,396,745 B1 | 5/2002 | Hong et al. |
| 6,424,001 B1 | 7/2002 | Forbes et al. |
| 6,433,382 B1 | 8/2002 | Orlowski et al. |
| 6,433,383 B1 | 8/2002 | Ramsbey et al. |
| 6,440,801 B1 | 8/2002 | Furukawa et al. |
| 6,461,905 B1 | 10/2002 | Wang et al. |
| 6,461,931 B1 | 10/2002 | Eldridge |
| 6,465,836 B2 | 10/2002 | Lin et al. |
| 6,475,857 B1 | 11/2002 | Kim et al. |
| 6,476,434 B1 | 11/2002 | Noble et al. |
| 6,504,207 B1 | 1/2003 | Chen et al. |
| 6,514,842 B1 | 2/2003 | Prall et al. |
| 6,519,176 B1 * | 2/2003 | Hamzaoglu et al. ......... 365/154 |
| 6,521,943 B1 | 2/2003 | Mine et al. |
| 6,541,280 B2 | 4/2003 | Kaushik et al. |
| 6,566,682 B2 | 5/2003 | Forbes |
| 6,574,143 B2 | 6/2003 | Nakazato |
| 6,580,124 B1 | 6/2003 | Cleeves et al. |
| 6,586,797 B2 | 7/2003 | Forbes et al. |
| 6,730,575 B2 | 5/2004 | Eldridge |
| 6,740,928 B2 | 5/2004 | Yoshii et al. |
| 6,753,568 B1 | 6/2004 | Nakazato et al. |
| 6,753,571 B2 | 6/2004 | Kim et al. |
| 6,754,108 B2 | 6/2004 | Forbes |
| 6,778,441 B2 | 8/2004 | Forbes et al. |
| 6,794,250 B2 | 9/2004 | Chang et al. |
| 6,800,895 B2 | 10/2004 | Chang et al. |
| 6,881,994 B2 | 4/2005 | Lee et al. |
| 6,894,944 B2 | 5/2005 | Ishibashi et al. |
| 6,903,367 B2 | 6/2005 | Forbes |
| 6,950,340 B2 | 9/2005 | Bhattacharyya |
| 6,952,032 B2 | 10/2005 | Forbes et al. |
| 6,958,937 B2 | 10/2005 | Forbes et al. |
| 6,963,103 B2 * | 11/2005 | Forbes ...................... 257/315 |
| 7,027,328 B2 | 4/2006 | Forbes et al. |
| 7,068,544 B2 | 6/2006 | Forbes et al. |
| 7,074,673 B2 | 7/2006 | Forbes |
| 7,075,829 B2 | 7/2006 | Forbes |
| 7,087,954 B2 | 8/2006 | Forbes |
| 7,112,841 B2 | 9/2006 | Eldridge et al. |
| 7,126,183 B2 | 10/2006 | Forbes et al. |
| 7,132,711 B2 | 11/2006 | Forbes et al. |
| 7,135,734 B2 | 11/2006 | Eldridge et al. |
| 7,136,302 B2 | 11/2006 | Forbes et al. |
| 7,153,744 B2 | 12/2006 | Chen et al. |
| 7,154,138 B2 | 12/2006 | Hofmann et al. |
| 7,163,863 B2 | 1/2007 | Shone |
| 7,166,886 B2 | 1/2007 | Forbes |
| 7,187,587 B2 | 3/2007 | Forbes |
| 7,205,601 B2 | 4/2007 | Lee et al. |
| 7,274,067 B2 | 9/2007 | Forbes |
| 2001/0013621 A1 | 8/2001 | Nakazato |
| 2001/0041250 A1 | 11/2001 | Werkhoven et al. |
| 2002/0008324 A1 | 1/2002 | Shinkawata |
| 2002/0024083 A1 | 2/2002 | Noble et al. |
| 2002/0106536 A1 | 8/2002 | Lee et al. |
| 2002/0109138 A1 | 8/2002 | Forbes |
| 2002/0110973 A1 | 8/2002 | Liou et al. |

| | | |
|---|---|---|
| 2002/0110983 A1 | 8/2002 | Liu et al. |
| 2002/0137250 A1 | 9/2002 | Nguyen et al. |
| 2002/0140022 A1 | 10/2002 | Lin et al. |
| 2002/0175326 A1 | 11/2002 | Reed et al. |
| 2002/0176293 A1 | 11/2002 | Forbes et al. |
| 2003/0042528 A1 | 3/2003 | Forbes |
| 2003/0043637 A1 | 3/2003 | Forbes et al. |
| 2003/0134475 A1 | 7/2003 | Hofmann et al. |
| 2004/0032773 A1 | 2/2004 | Forbes |
| 2004/0160830 A1 | 8/2004 | Forbes |
| 2004/0207038 A1 | 10/2004 | Hofmann et al. |
| 2005/0023595 A1 | 2/2005 | Forbes et al. |
| 2005/0023602 A1 | 2/2005 | Forbes et al. |
| 2005/0023603 A1 | 2/2005 | Eldridge et al. |
| 2005/0024945 A1 | 2/2005 | Forbes |
| 2005/0026349 A1 | 2/2005 | Forbes et al. |
| 2006/0001049 A1 | 1/2006 | Forbes |
| 2006/0002192 A1 | 1/2006 | Forbes et al. |
| 2006/0199338 A1 | 9/2006 | Eldridge et al. |
| 2006/0231886 A1 | 10/2006 | Forbes et al. |
| 2006/0234450 A1 | 10/2006 | Forbes et al. |
| 2006/0237768 A1 | 10/2006 | Forbes et al. |
| 2006/0263981 A1 | 11/2006 | Forbes |
| 2006/0274580 A1 | 12/2006 | Forbes |
| 2006/0278917 A1 | 12/2006 | Forbes et al. |
| 2007/0018214 A1 | 1/2007 | Ahn |
| 2007/0105313 A1 | 5/2007 | Forbes |
| 2007/0138534 A1 | 6/2007 | Eldridge et al. |
| 2007/0145462 A1 | 6/2007 | Eldridge et al. |
| 2007/0178635 A1 | 8/2007 | Eldridge et al. |

OTHER PUBLICATIONS

Aarik, Jaan, et al., "Texture development in nanocyrstalline hafnium dioxide thin films grown by atomic layer deposition", *Journal of Crystal Growth*, 220(1-2), (Nov. 15, 2000), 105-113.

Afanas'ev, V, et al., "Electron energy barriers between (100)Si and ultrathin stacks of SiO2, Al2O3, and ZrO3 and ZrO2 insulators", *Applied Physics Letters*, 78(20), (May 14, 2001), 3073-3075.

Arya, S. P., et al., "Conduction properties of thin Al/sub 2/O/sub 3/ films", *Thin Solid Films*, 91(4), (May 28, 1982), 363-374.

Dipert, Brian, "Flash Memory Goes Mainstream", *IEEE Spectrum*, 30(10), (Oct. 1993), 48-52.

Eierdal, L., et al., "Interaction of oxygen with Ni(110) studied by scanning tunneling microscopy", *Surface Science*, 312(1-2), (Jun. 1994), 31-53.

Eldridge, J. M., et al., "Analysis of ultrathin oxide growth on indium", *Thin Solid Films*, 12(2), (Oct. 1972), 447-451.

Eldridge, J. M., et al., "Growth of Thin PbO Layers on Lead Films. I. Experiment", *Surface Science*, 40(3), (Dec. 1973), 512-530.

Eldridge, J., et al., "Measurement of Tunnel Current Density in a Metal-Oxide-Metal System as a Function of Oxide Thickness", *Proc. 12th Intern. Conf. on Low Temperature Physics*, (1971), 427-428.

Ferguson, J D., et al., "Atomic layer deposition of Al2O3 and SiO2 on BN particles using sequential surface reactions", *Applied Surface Science*, 162-163, (Aug. 1, 2000), 280-292.

Greiner, J., "Josephson Tunneling Barriers by rf Sputter Etching in an Oxygen Plasma", *Journal of Applied Physics*, 42(12), (Nov. 1971), 5151-5155.

Greiner, J., "Oxidation of lead films by rf sputter etching in an oxygen plasma", *Journal of Applied Physics*, 45(1), (Jan. 1974), 32-37.

Grimbolt, J., "I. Interaction of Al Films with O2 at Low Pressures", *Journal of the Electrochemical Society*, 129(10), (1982), pp. 2366-2368.

Grimbolt, J., "II. Oxidation of Al Films", *Journal of Electrochem Soc.: Solid-State Science and Technology*, (1982), pp. 2369-2372.

Gundlach, K., et al., "Logarithmic conductivity of Al-Al/sub 2/O/sub 3/-Al tunneling junctions produced by plasma- and by thermal-oxidation", *Surface Science*, 27(1), (Aug. 1971), 125-141.

Guo, X., "High Quality Ultra-thin (1.5 nm) High quality ultra-thin (1.5 nm) TiO/sub 2/-Si/sub 3/N/sub 4/ gate dielectric for deep sub-micron CMOS technology", *International Electron Devices Meeting 1999. Technical Digest*, (1999), 137-140.

Hodges, D. A., et al., "Analysis and Design of Digital Integrated Circuits", *McGraw-Hill Book Company*, 2nd Edition, (1988), 394-396.

Hurych, Z., "Influence of Non-Uniform Thickness of Dielectric Layers on Capacitance and Tunnel Currents", *Solid-State Electronics*, 9, (1966), 967-979.

Itokawa, H, "Determination of Bandgap and Energy Band Alignment for High-Dielectric-Constant Gate Insulators Using High-Resolution X-ray Photoelectron Spectroscopy", *Extended Abstracts of the 1999 International Conference on Solid State Devices and Materials*, (1999), 158-159.

Kim, Yong S., et al., "Effect of rapid thermal annealing on the structure and the electrical properties of atomic-layer-deposited Ta2O5 films", *Journal of the Korean Physical Society*, (Dec. 2000), 975-979.

Kim, H., "Leakage current and electrical breakdown in metal-organic chemical vapor deposited TiO/sub 2/ dielectrics on silicon substrates", *Applied Physics Letters*, 69(25), (Dec. 16, 1996), 3860-3862.

Kim, Yeong K., et al., "Novel capacitor technology for high density stand-alone and embedded DRAMs", *International Electron Devices Meeting 2000. Technical Digest. IEDM*, (2000), 369-372.

Kubaschewski, O., et al., "Oxidation of Metals and Alloys", *Butterworths*, London, (1962), 53-63.

Kubaschewski, O., et al., "Oxidation of Metals and Alloys,", *Butterworths*, London, Second Edition,(1962), 1-3, 5, 6, 8-12, 24, 36-39.

Kukli, Kaupo, "Atomic Layer Deposition of Titanium Oxide from TiI4 and H2O2", *Chemical Vapor Deposition*, 6(6), (2000), 303-310.

Kukli, Kaupo, "Atomic layer deposition of zirconium oxide from zirconium tetraiodide, water and hydrogen peroxide", *Journal of Crystal Growth*, 231(1-2), (Sep. 2001), 262-272.

Kukli, K., "Development of Dielectric Properties of Niobium Oxide, Tantalum Oxide, and Aluminum Oxide Based Nanolayered Materials", *Journal of the Electrochemical Society*, 148(2), (Feb. 2001), F35-F41.

Kukli, Kaupo, et al., "Real-time monitoring in atomic layer deposition of TiO/sub 2/ from TiI/sub 4/ and H/sub 2/O-H/sub 2/O/ sub 2/", *Langmuir*, 16(21), (Oct. 17, 2000), 8122-8128.

Kwo, J., "Properties of high k gate dielectrics Gd2O3 and Y2O3 for Si", *Journal of Applied Physics*, 89(7), (2001), 3920-3927.

Lee, J., et al., "Effect of polysilicon gate on the flatband voltage shift and mobility degradation for ALD-Al/sub 2/O/sub 3/ gate dielectric", *International Electron Devices Meeting 2000. Technical Digest. IEDM*, (2000), 645-648.

Luan, H. F., "High Quality Ta2O5 Gate Dielectrics with Tox,eq<10A", *IEDM Technical Digest. International Electron Devices Meeting*, (Dec. 5-8, 1999), 141-143.

Ma, Yanjun, et al., "Zirconium oxide based gate dielectrics with equivalent oxide thickness of less than 1.0 nm and performance of submicron MOSFET using a nitride gate replacement process", *International Electron Devices Meeting 1999. Technical Digest*, (1999), 149-152.

Marshalek, R., et al., "Photoresponse Characteristics of Thin-Film Nickel-Nickel Oxide-Nickel Tunneling Junctions", *IEEE Journal of Quantum Electronics*, QE-19(4), (1983), 743-754.

Masuoka, F., et al., "A 256K Flash EEPROM using Triple Polysilicon Technology", *IEEE International Solid-State Circuits Conference, Digest of Technical Papers*, (1985), 168-169.

Masuoka, F., et al., "A New Flash EEPROM Cell using Triple Polysilicon Technology", *International Electron Devices Meeting, Technical Digest*, San Francisco, CA,(1984), 464-467.

Mori, S., et al., "Reliable CVD Inter-Poly Dielectrics for Advanced E&EEPROM", *Symposium on VLSI Technology, Digest of Technical Papers*, (1985), 16-17.

Muller, H., "Electrical and Optical Properties of Sputtered In2O3 Films", *Physica Status Solidi*, 27(2), (1968), 723-731.

Paranjpe, Ajit, et al., "Atomic layer deposition of AlOx for thin film head gap applications", *Journal of the Electrochemical Society*, 148(9), (Sep. 2001), 465-471.

Pashley, R., et al., "Flash Memories: the best of two worlds", *IEEE Spectrum*, 26(12), (Dec. 1989), 30-33.

Pollack, S., et al., "Tunneling Through Gaseous Oxidized Films of Al2O3", *Transactions of the Metallurgical Society of AIME*, 233, (1965), 497-501.

Qi, Wen-Jie, et al., "MOSCAP and MOSFET characteristics using ZrO/sub 2/gate dielectric deposited directly on Si", *International Electron Devices Meeting 1999. Technical Digest*, (1999), 145-148.

Robertson, J., "Band offsets of wide-band-gap oxides and implications for future electronic devices", *Journal of Vacuum Science & Technology B (Microelectronics and Nanometer Structures)*, 18(3), (May-Jun. 2000), 1785-1791.

Robertson, J., et al., "Schottky Barrier height of Tantalum oxide, barium strontium titanate, lead titanate, and strontium bismuth tantalate", *Applied Physics Letters*, 74(8), (Feb. 22, 1999), 1168-1170.

Shi, Ying, et al., "Tunneling Leakage Current in Ultrathin (<4 nm) Nitride/Oxide Stack Dielectrics", *IEEE Electron Device Letters*, 19(10), (Oct. 1998), 388-390.

Simmons, J., "Generalized Formula for the Electric Tunnel Effect between Similar Electrodes Separated by a Thin Insulating Film", *Journal of Applied Physics*, 34(6), (1963), 1793-1803.

Smith, Ryan C., et al., "Chemical vapour deposition of the oxides of titanium, zirconium and hafnium for use as high-k materials in microelectronic devices. A carbon-free precursor for the synthesis of hafnium dioxide", *Advanced Materials for Optics and Electronics*, 10(3-5), (May-Oct. 2000), 105-106.

Swalin, R., "Equilibrium between Phases of Variable Composition", In: *Thermodynamics of solids*, New York, J. Wiley, 2nd Edition, (1972), 165-180.

Sze, S., "Physics of Semiconductor Devices, Second Edition", *John Wiley & Sons*, New York, (1981),553-556.

Yan, J., "Structural and electrical characterization of TiO2 grown from titanium tetrakis-isopropoxide (TTIP) and TTIP/H2O ambients", *Journal of Vacuum Science Technology B* 14(3), (1996), 1706-1711.

Zhang, H., "Atomic layer deposition of high dielectric constant nanolaminates", *Journal of The Electrochemical Society*, 148(4), (Apr. 2001), F63-F66.

Ahn, Kie Y., et al., "Magnesium Titanium Oxide Films", *U. S. Appl. No. 11/189,075, filed Jul. 25, 2005*.

Eitan, Boaz, et al., "NROM: A Novel Localized Trapping, 2-Bit Nonvolatile Memory Cell", *IEEE Electron Device Letters, 21(11)*, (Nov. 2000),543-545.

U.S. Appl. No. 10/081,818, Notice of Allowance mailed Oct. 30, 2007, 7 pgs.

U.S. Appl. No. 10/929,986, Notice of Allowance mailed Oct. 29, 2007, 7 pgs.

U.S. Appl. No. 10/931,704, Notice of Allowance mailed Nov. 23, 2007, NOAR,13 pgs.

U.S. Appl. No. 11/471,007, Response filed Nov. 16, 2007 to Non-Final Office Action mailed Aug. 16, 2007, 12 pgs.

U.S. Appl. No. 11/471,348, Response filed Nov. 21, 2007 to Non-Final Office Action mailed Aug. 23, 2007, 10 p.

U.S. Appl. No. 11/704,458, Non-Final Office Action mailed Nov. 1, 2007, 19 pgs.

U.S. Appl. No. 11/708,438, Non Final Office Action mailed Oct. 29, 2007, 5 pgs.

"U.S. Appl. No. 09/943,134 Amendment Under 37 CFR 1.312 mailed Jun. 10, 2005", 6 pgs.

"U.S. Appl. No. 09/943,134 Non Final Office Action mailed Jan. 8, 2003", 13 pgs.

"U.S. Appl. No. 09/943,134 Notice of Allowance mailed Feb. 13, 2004", 4 pgs.

"U.S. Appl. No. 09/943,134 Notice of Allowance mailed Apr. 7, 2005", 4 pgs.

"U.S. Appl. No. 09/943,134 Notice of Allowance mailed Jun. 4, 2003", 5 pgs.

"U.S. Appl. No. 09/943,134 Notice of Allowance mailed Nov. 5, 2004", 4 pgs.

"U.S. Appl. No. 09/943,134 Response filed Apr. 8, 2003 to Non Final Office Action mailed Jan. 8, 2003", 15 pgs.

"U.S. Appl. No. 09/945,395 Amendment Under 37 CFR 1.312 mailed Feb. 10, 2004", 15 pgs.

"U.S. Appl. No. 09/945,395 Amendment Under 37 CFR 1.312 mailed Apr. 17, 2003", 4 pgs.

"U.S. Appl. No. 09/945,395 Non Final Office Action mailed Nov. 6, 2002", 13 pgs.

"U.S. Appl. No. 09/945,395 Notice of Allowance mailed Feb. 28, 2003", 9 pgs.

"U.S. Appl. No. 09/945,395 Notice of Allowance mailed Jul. 30, 2003", 5 pgs.

"U.S. Appl. No. 09/945,395 Notice of Allowance mailed Dec. 30, 2003", 4 pgs.

"U.S. Appl. No. 09/945,395 Response filed Feb. 6, 2003 to Non Final Office Action mailed Nov. 6, 2002", 8 pgs.

"U.S. Appl. No. 09/945,498 Notice of Allowance mailed Mar. 11, 2004", 4 pgs.

"U.S. Appl. No. 09/945,498 Notice of Allowance mailed May 15, 2003", 6 pgs.

"U.S. Appl. No. 09/945,498 Notice of Allowance mailed Sep. 10, 2003", 3 pgs.

"U.S. Appl. No. 09/945,498 Notice of Allowance mailed Dec. 3, 2002", 7 pgs.

"U.S. Appl. No. 09/945,500 Non-final office action mailed Dec. 24, 2002", 5 pgs.

"U.S. Appl. No. 09/945,500 Notice of allowance mailed Mar. 29, 2005", 4 pgs.

"U.S. Appl. No. 09/945,500 Notice of allowance mailed May 19, 2004", 4 pgs.

"U.S. Appl. No. 09/945,500 Notice of allowance mailed Aug. 12, 2005", 2 pgs.

"U.S. Appl. No. 09/945,500 Notice of allowance mailed Dec. 2, 2005", 2 pgs.

"U.S. Appl. No. 09/945,500 Notice of allowance mailed Dec. 12, 2003", 5 pgs.

"U.S. Appl. No. 09/945,500 Response filed Mar. 24, 2003 to final office action mailed Dec. 24, 2002", 17 pgs.

"U.S. Appl. No. 09/945,507 Non-final office action mailed Jun. 17, 2003", 7 pgs.

"U.S. Appl. No. 09/945,507 Notice of allowance mailed Mar. 9, 2004", 5 pgs.

"U.S. Appl. No. 09/945,507 Notice of allowance mailed Jun. 3, 2005", 2 pgs.

"U.S. Appl. No. 09/945,507 Notice of allowance mailed Nov. 3, 2003", 7 pgs.

"U.S. Appl. No. 09/945,507 Notice of allowance mailed Nov. 18, 2004", 7 pgs.

"U.S. Appl. No. 09/945,507 Nootice of allowance mailed Dec. 29, 2005", 2 pgs.

"U.S. Appl. No. 09/945,507 Response filed Oct. 17, 2003 to Non Final Office Action mailed Jun. 17, 2003", 15 pgs.

"U.S. Appl. No. 09/945,512 Amendment filed Feb. 11, 2004", 23 pgs.

"U.S. Appl. No. 09/945,512 Final office action mailed Oct. 13, 2005", 6 pgs.

"U.S. Appl. No. 09/945,512 Non final office action mailed Jun. 30, 2005", 8 pgs.

"U.S. Appl. No. 09/945,512 Non-final office action mailed Dec. 20, 2002", 9 pgs.

"U.S. Appl. No. 09/945,512 Notice of allowance mailed Jan. 31, 2006", 4 pgs.

"U.S. Appl. No. 09/945,512 Notice of allowance mailed Feb. 22, 2005", 7 pgs.

"U.S. Appl. No. 09/945,512 Notice of allowance mailed May 27, 2004", 7 pgs.

"U.S. Appl. No. 09/945,512 Notice of allowance mailed Jun. 17, 2003", 12 pgs.

"U.S. Appl. No. 09/945,512 Notice of allowance mailed Dec. 11, 2003", 7 pgs.

"U.S. Appl. No. 09/945,512 Response filed Jan. 13, 2006 to final office action mailed Jan. 28, 2006", 28 pgs.

"U.S. Appl. No. 09/945,512 Response filed Mar. 20, 2003 to non-final office action mailed Dec. 20, 2003", 30 pgs.

"U.S. Appl. No. 09/945,512 Response filed Sep. 29, 2005 to non-final office action mailed Jun. 30, 2005", 10 pgs.

"U.S. Appl. No. 09/945,554 Final office action mailed Mar. 12, 2004", 8 pgs.

"U.S. Appl. No. 09/945,554 Non-final office mailed Oct. 22, 2003", 7 pgs.
"U.S. Appl. No. 09/945,554 Non-final office action mailed Dec. 13, 2002", 13 pgs.
"U.S. Appl. No. 09/945,554 Notice of allowance mailed May 2, 2003", 8 pgs.
"U.S. Appl. No. 09/945,554 Notice of allowance mailed Jun. 1, 2004", 2 pgs.
"U.S. Appl. No. 09/945,554 Notice of allowance mailed Nov. 22, 2004", 2 pgs.
"U.S. Appl. No. 09/945,554 Response filed Jan. 22, 2004 to final office action mailed Oct. 22, 2003", 35 pgs.
"U.S. Appl. No. 09/945,554 Response filed Mar. 13, 2003 to final office action mailed Mar. 13, 2003", 3 pgs.
"U.S. Appl. No. 09/945,554 Response filed May 12, 2004 to final office action mailed Mar. 12, 2004", 21 pgs.
"U.S. Appl. No. 10/028,001 non-final office action mailed Oct. 12, 2005", 12 pgs.
"U.S. Appl. No. 10/028,001 non-final office action mailed Nov. 2, 2004", 5 pgs.
"U.S. Appl. No. 10/028,001 non-final office action mailed Feb. 14, 2003", 12 pgs.
"U.S. Appl. No. 10/028,001 Notice of allowance mailed Nov. 19, 2003", 4 pgs.
"U.S. Appl. No. 10/028,001 Notice of allowance mailed Feb. 1, 2006", 4 pgs.
"U.S. Appl. No. 10/028,001 Notice of allowance mailed Feb. 25, 2005", 4 pgs.
"U.S. Appl. No. 10/028,001 Notice of allowance mailed Apr. 16, 2004", 4 pgs.
"U.S. Appl. No. 10/028,001 Notice of allowance mailed Jun. 2, 2006", 3 pgs.
"U.S. Appl. No. 10/028,001 Notice of allowance mailed Jun. 3, 2003", 3 pgs.
"U.S. Appl. No. 10/028,001 Response filed Jan. 12, 2006 Non-Final Office Action mailed Oct. 12, 2005", 15 pgs.
"U.S. Appl. No. 10/028,001 Response filed Feb. 2, 2005 Non-Final Office Action mailed Nov. 2, 2004", 12 pgs.
"U.S. Appl. No. 10/028,001 Response filed May 14, 2003 Non-Final Office Action mailed Feb. 14, 2003", 27 pgs.
"U.S. Appl. No. 10/081,818 Final office action mailed Oct. 5, 2005", 13 pgs.
"U.S. Appl. No. 10/081,818 Non-final office action mailed Jan. 2, 2003", 11 pgs.
"U.S. Appl. No. 10/081,818 Non-final office action mailed Mar. 24, 2006", 14 pgs.
"U.S. Appl. No. 10/081,818 Non-final office action mailed Apr. 29, 2005", 13 pgs.
"U.S. Appl. No. 10/081,818 Non-final office action mailed Oct. 15, 2004", 6 pgs.
"U.S. Appl. No. 10/081,818 Notice of allowance mailed Feb. 13, 2004", 4 pgs.
"U.S. Appl. No. 10/081,818 Notice of allowance mailed Feb. 22, 2005", 4 pgs.
"U.S. Appl. No. 10/081,818 Notice of allowance mailed Mar. 8, 2007", 3 pgs.
"U.S. Appl. No. 10/081,818 Notice of allowance mailed Sep. 21, 2006", 2 pgs.
"U.S. Appl. No. 10/081,818 Notice of allowance mailed Sep. 26, 2003", 5 pgs.
"U.S. Appl. No. 10/081,818 Response filed Apr. 2, 2003 to non final action mailed Jan. 2, 2003", 12 pgs.
"U.S. Appl. No. 10/081,818 Response filed Jul. 29, 2005 to non final office action mailed Apr. 29, 2005", 21 pgs.
"U.S. Appl. No. 10/081,818 Response filed Aug. 24, 2006 to non final office action mailed Mar. 24, 2006", 16 pgs.
"U.S. Appl. No. 10/081,818 Response filed Jan. 14, 2005 Non-Final Office Action mailed Oct. 15, 2004", 8 pgs.
"U.S. Appl. No. 10/081,818 Response filed Mar. 3, 2006 Final Office Action mailed Oct. 5, 2005", 14 pgs.
"U.S. Appl. No. 10/177,096 Non Final Office Action mailed Jun. 14, 2005", 18 pgs.
"U.S. Appl. No. 10/177,096 Non-Final Office Action mailed Jun. 10, 2003", 10 pgs.
"U.S. Appl. No. 10/177,096 Notice of Allowance mailed Apr. 6, 2004", 7 pgs.
"U.S. Appl. No. 10/177,096 Notice of Allowance mailed May 18, 2006", 7 pgs.
"U.S. Appl. No. 10/177,096 Notice of Allowance mailed Oct. 6, 2005", 8 pgs.
"U.S. Appl. No. 10/177,096 Notice of allowance mailed Nov. 14, 2003", 3 pgs.
"U.S. Appl. No. 10/177,096 Response fled Sep. 8, 2005 to non final office action mailed Jun. 14, 2005", 34 pgs.
"U.S. Appl. No. 10/177,096 Response filed Oct. 10, 2003 to non final office action mailed Jun. 10, 2003", 55 pgs.
"U.S. Appl. No. 10/781,035 Final office action mailed Oct. 5, 2005", 16 pgs.
"U.S. Appl. No. 10/781,035 Non-final office action mailed Jun. 2, 2005", 14 pgs.
"U.S. Appl. No. 10/781,035 Non-Final office action mailed Jun. 22, 2004", 4 pgs.
"U.S. Appl. No. 10/781,035 Notice of allowance mailed Jan. 30, 2006", 5 pgs.
"U.S. Appl. No. 10/781,035 Notice of allowance mailed Oct. 28, 2004", 5 pgs.
"U.S. Appl. No. 10/781,035 Notice of allowance mailed May 18, 2006", 5 pgs.
"U.S. Appl. No. 10/781,035 Response filed Jan. 5, 2006 to final office action mailed Oct. 5, 2005", 20 pgs.
"U.S. Appl. No. 10/781,035 Response filed Sep. 1, 2005 to non final office action mailed Jun. 2, 2005", 26 pgs.
"U.S. Appl. No. 10/781,035 Response filed Sep. 22, 2004 to non final office action mailed Jun. 22, 2004", 11 pgs.
"U.S. Appl. No. 10/783,695 Amendment Under CFR 1.312 mailed Nov. 20, 2006", 21 pgs.
"U.S. Appl. No. 10/783,695 Non Final Office Action mailed Jul. 1, 2005", 8 pgs.
"U.S. Appl. No. 10/783,695 Notice of Allowance mailed Aug. 22, 2006", 5 pgs.
"U.S. Appl. No. 10/783,695 Notice of Allowance mailed Dec. 20, 2005", 4 pgs.
"U.S. Appl. No. 10/783,695 Response filed Aug. 3, 2005 to Non Final Office Action mailed Jul. 1, 2005", 24 pgs.
"U.S. Appl. No. 10/788,810 Non-final office action mailed Aug. 12, 2004", 15 pgs.
"U.S. Appl. No. 10/788,810 Notice of allowance mailed Jan. 9, 2006", 9 pgs.
"U.S. Appl. No. 10/788,810 Notice of allowance mailed Mar. 22, 2005", 7 pgs.
"U.S. Appl. No. 10/788,810 Notice of allowance mailed Jul. 28, 2005", 9 pgs.
"U.S. Appl. No. 10/788,810 Response filed Dec. 13, 2004 to no-final office action mailed Dec. 13, 2004", 22 pgs.
"U.S. Appl. No. 10/819,550 Amendment Under 37 CFR 1.312 mailed Jan. 9, 2006", 10 pgs.
"U.S. Appl. No. 10/789,038 Notice of Allowance mailed Oct. 7, 2005", 11 pgs.
"U.S. Appl. No. 10/819,550 Amendment Under 37 CFR 1.312 mailed Mar. 31, 2005", 13 pgs.
"U.S. Appl. No. 10/819,550 Non Final Office Action mailed Sep. 21, 2004", 18 pgs.
"U.S. Appl. No. 10/819,550 Notice of Allowance mailed Jan. 28, 2005", 7 pgs.
"U.S. Appl. No. 10/819,550 Response filed Dec. 21, 2004 to Non Final Office Action mailed Sep. 21, 2004", 27 pgs.
"U.S. Appl. No. 10/926,916, Response filed Apr. 26, 2006 Non-Final Office Action mailed Jan. 26, 2006", 27 pgs.
"U.S. Appl. No. 10/929,916 non-final office action mailed Jan. 26, 2006", 20 pgs.
"U.S. Appl. No. 10/929,916 non-final office action mailed Dec. 15, 2004", 4 pgs.
"U.S. Appl. No. 10/929,916 Notice of Allowance mailed Apr. 28, 2005", 5 pgs.

"U.S. Appl. No. 10/929,916 Notice of allowance mailed Jun. 6, 2006", 4 pgs.

"U.S. Appl. No. 10/929,916 Response filed Mar. 15, 2005 to non-final office action mailed Dec. 15, 2004", 18 pgs.

"U.S. Appl. No. 10/929,986 Notice of Allowance mailed Jan. 4, 2005", 7 pgs.

"U.S. Appl. No. 10/929,986 Notice of Allowance mailed Mar. 8, 2007", 6 pgs.

"U.S. Appl. No. 10/929,986 Notice of Allowance mailed Apr. 21, 2005", 12 pgs.

"U.S. Appl. No. 10/929,986 Notice of Allowance mailed May 4, 2006", 5 pgs.

"U.S. Appl. No. 10/929,986 Notice of Allowance mailed Sep. 21, 2006", 7 pgs.

"U.S. Appl. No. 10/931,540 Amendment Under 37 CFR 1.312 mailed May 12, 2005", 17 pgs.

"U.S. Appl. No. 10/931,540 Notice of Allowance mailed Apr. 20, 2005", 8 pgs.

"U.S. Appl. No. 10/931,540 Notice of Allowance mailed Dec. 13, 2004", 12 pgs.

"U.S. Appl. No. 10/931,704 Non Final Office Action mailed Apr. 19, 2007", 5 pgs.

"U.S. Appl. No. 10/931,704 Response filed Aug. 20, 2007 to Non Final Office Action mailed Apr. 19, 2007", 10 pgs.

"U.S. Appl. No. 10/931,704 Notice of Allowance mailed Sep. 21, 2007", NOAR, 14 pgs.

"U.S. Appl. No. 10/931,711 Final office action mailed Nov. 15, 2005", 12 pgs.

"U.S. Appl. No. 10/931,711 Non-final office action mailed Jun. 28, 2005", 24 pgs.

"U.S. Appl. No. 10/931,711 Notive of allowance mailed May 31, 2006", 9 pgs.

"U.S. Appl. No. 10/931,711 Notice of allowance mailed Sep. 18, 2006", 8 pgs.

"U.S. Appl. No. 10/931,711 Response filed Jan. 17, 2006 to final office action mailed Nov. 15, 2005", 28 pgs.

"U.S. Appl. No. 10/931,711 Response filed Sep. 28, 2005 to non-final office action mailed Jun. 28, 2005", 34 pgs.

"U.S. Appl. No. 10/202,460 Non final office action mailed Jan. 4, 2007", 18 pgs.

"U.S. Appl. No. 10/202,460 Notice of allowance mailed May 17, 2007", 6 pgs.

"U.S. Appl. No. 10/202,460 Response filed Mar. 23, 2007 to non-final office action mailed Jan. 4, 2007", 17 pgs.

"U.S. Appl. No. 10/212,190 Notice of allowance mailed Jan. 12, 2006", 6 pgs.

"U.S. Appl. No. 10/380,599 Non-final office action mailed Mar. 16, 2007", 21 pgs.

"U.S. Appl. No. 10/380,599 Notice of Allowance Mailed Aug. 16, 2007", NOAR, 8 pgs.

"U.S. Appl. No. 10/380,599 Response filed Jul. 13, 2007 to non-final office action mailed Mar. 16, 2007", 24 pgs.

"U.S. Appl. No. 10/471,007 Non-Final Office Action Mailed Aug. 16, 2007", OARN, 15 pgs.

"U.S. Appl. No. 10/471,008 Non Final Office Action Mailed Aug. 15, 2007", OARN, 17 pgs.

"U.S. Appl. No. 10/471,348, Non-Final Office Action Mailed Aug. 23, 2007", OARN, 12 pgs.

* cited by examiner

SRAM CELLS WITH REPRESSED FLOATING GATE MEMORY, LOW TUNNEL BARRIER INTERPOLY INSULATORS

CROSS REFERENCE TO RELATED APPLICATIONS

The present application is a divisional of U.S. application Ser. No. 09/945,554, filed Aug. 30, 2001, now issued as U.S. Pat. No. 6,963,103, which is incorporated herein by reference in its entirety.

This application is related to the following commonly assigned U.S. patent applications: "DRAM Cells with Repressed Memory Metal Oxide Tunnel Insulators," Ser. No. 09/945,395, U.S. Pat. No. 6,754,108; "Programmable Array Logic or Memory Devices with Asymmetrical Tunnel Barriers," Ser. No. 09/943,134, now issued as U.S. Pat. No. 7,042,043; "Dynamic Electrically Alterable Programmable Memory with Insulating Metal Oxide Interpoly Insulators," Ser. No. 09/945,498, U.S. Pat. No. 6,778,441; and "Field Programmable Logic Arrays with Metal Oxide and/or Low Tunnel Barrier Interpoly Insulators," Ser. No. 09/945,512, now issued as U.S. Pat. No. 7,087,954; "Flash Memory with Low Tunnel Barrier Interpoly Insulators," Ser. No. 09/945,507, now issued as U.S. Pat. No. 7,068,544; and "Programmable Memory Address and Decode Devices with Low Tunnel Barrier Interpoly Insulators," Ser. No. 09/945,500, now issued as U.S. Pat. No. 7,075,829; which were filed on Aug. 30, 2001, and each of which disclosure is herein incorporated by reference.

FIELD OF THE INVENTION

The present invention relates generally to integrated circuits, and in particular to SRAM cells with repressed floating gate memory, metal oxide tunnel interpoly insulators.

BACKGROUND OF THE INVENTION

An essential semiconductor device is semiconductor memory, such as a random access memory (RAM) device. A RAM device allows the user to execute both read and write operations on its memory cells. Typical examples of RAM devices include dynamic random access memory (DRAM) and static random access memory (SRAM).

As stated, SRAM devices are one form of RAM device. SRAM devices differ from DRAM devices in that they do not require constant refreshing. A standard SRAM cell 100 is shown in FIG. 1A. Cell 100 consists of four transistors 106, 108, 110, 112, and two control transistors 102 and 104. Data is stored with either a high potential at node A and a low potential at node B, or a low potential at node A and a high potential at node B. This means that two stable states are available which are defined as a logic "1" or a logic "0".

In FIG. 1A, the logic state of SRAM cell 100, i.e., either a "1" or "0", is read by sensing the cell current on bit line pair comprised of bit lines 116 and 117 and/or the differential voltage developed thereon. When word line 118 is selected, cell 100 is activated by turning on control transistors 102 and 104. If the activated SRAM cell 100 is in logic state "1" node A is high and node B is low. Transistor 108 will be off, transistor 112 will be on, transistor 106 will be on, and transistor 110 will be off. Since transistors 112 and 104 are on, bit line 117 will carry cell current, while bit line 116 will not carry any cell current since transistor 108 is off.

The logic state "0" would be the opposite with node A low and node B high. Transistor 108 will be on, transistor 112 will be off, transistor 106 will be off, and transistor 110 will be on. Bit line 116 will carry cell current, while bit line 117 will not carry cell current.

FIG. 1B illustrates an alternative SRAM cell 150 as contained in the prior art. In this cell 150, transistors 206 and 210 are replaced by two resistors 252, 254. The operation of the cell 150, however, is essentially the same as the operation of the cell 100 (FIG. 1A). The SRAM cell 150 can also be used in and accessed from the memory and SRAM devices illustrated and described below in FIGS. 2 and 3.

Thus, FIGS. 1A and 1B illustrate conventional SRAM devices. If the SRAM cell is perfectly symmetrical then upon start-up or power supply voltage, Vdd, being applied the two output nodes, V1 and V2, both go to the same potential 1.25V. In reality of course the cell can never be perfectly symmetrical and random variations in parameters will cause it to start in some random configuration with either a "one" or "zero" stored in the cell.

These conventional SRAM cells can be fabricated with a built in asymmetry by making some devices with a threshold voltage, VT, larger than normal, and some devices normal by controlling the doping content of the devices. This can also be conventionally done by making some of the devices, e.g. transistors, larger than others. These approaches, however, add cost and complexity to the fabrication process.

Other alternative approaches for providing such built in asymmetry are described in U.S. Pat. No. 6,141,248, entitled "DRAM AND SRAM MEMORY CELLS WITH REPRESSED MEMORY," by L. Forbes, and A. R. Reinberg, issued Oct. 31, 2000; and U.S. Pat. No. 6,141,238, entitled "DYNAMIC RANDOM ACCESS MEMORY (DRAM) CELLS WITH REPRESSED FERROELECTRIC MEMORY METHODS OF READING SAME, AND APPARATUSES INCLUDING SAME," by L. Forbes, K. Y. Ahn, W. P. Noble and A. R. Reinberg, issued Oct. 31, 2000.

When the SRAM cells are programmed in this manner upon start-up and/or when power supply voltage is first applied to the cell it will always start in one preferred state with either a logic state "0" or a logic state "1" stored in the cell. The use of the SRAM cells programmed in this manner, where it can also be used as a PROM, would be useful in either embedded or stand alone SRAM. The cells can operate either as RAM or ROM, and could also be used as field or inservice programmable read only memories or electrically alterable programmable read only memories (EAPROM or EEPROM).

These products provide system level integration solutions for high volume applications that incorporate logic, memory and megacells system building blocks. Gate arrays and embedded arrays can combine over a million gates of logic, with SRAM, ROM, EEPROM and flash memories into a single chip. Memory blocks of volatile and non-volatile memory technology lets you integrate, on-chip: ROM, Flash, EEPROM and SRAM. Memory Compilers enable you to generate, to your exact specifications: SRAM (single-port, dual-port or FIFO) memory functions.

As before, a drawback to the above approaches is that they add cost and complexity to the fabrication process. Also, in conjunction with using floating gate transistors within the memory cells, there are additional problems to resolve. The following description for programming floating gate transistors explains some of these problems.

In order to enable a reasonable write speed the floating gate transistor uses channel hot electron injection, the erase operation which can be slower is achieved by Fowler-Nordhiem tunneling from the floating gate to the source. The large barriers to electron tunneling or hot electron injection presented by the silicon oxide-silicon interface, 3.2 eV, result in slow write and erase speeds even at very high electric fields. The combination of very high electric fields and damage by hot electron collisions in the oxide result in a number of operational problems like soft erase error, reliability problems of premature oxide breakdown and a limited number of cycles of write and erase.

Approaches to resolve the above described problems include; the use of different floating gate materials, e.g. SiC, SiOC, GaN, and GaAlN, which exhibit a lower work function, the use of structured surfaces which increase the localized electric fields, and amorphous SiC gate insulators with larger electron affinity, $\chi$, to increase the tunneling probability and reduce erase time.

However, all of these approaches relate to increasing tunneling between the floating gate and the substrate such as is employed in a conventional ETOX device and do not involve tunneling between the control gate and floating gate through and inter-poly dielectric.

The original EEPROM or EARPROM and flash memory devices described by Toshiba in 1984 used the interpoly dielectric insulator for erase. (See generally, F. Masuoka et al., "A new flash EEPROM cell using triple polysilicon technology," IEEE Int. Electron Devices Meeting, San Francisco, pp. 464-67, 1984; F. Masuoka et al., "256K flash EEPROM using triple polysilicon technology," IEEE Solid-State Circuits Conf., Philadelphia, pp. 168-169, 1985). Various combinations of silicon oxide and silicon nitride were tried. (See generally, S. Mori et al., "reliable CVD inter-poly dialectics for advanced E&EEPROM," Symp. On VLSI Technology, Kobe, Japan, pp. 16-17, 1985). However, the rough top surface of the polysilicon floating gate resulted in, poor quality interpoly oxides, sharp points, localized high electric fields, premature breakdown and reliability problems.

Therefore, there is a need in the art to provide improved SRAM cells for memory devices with a definitive asymmetry so that the cell always starts in a particular state. In this manner, the cell can be used both stand alone SRAM and for embedded SRAM in combination with a microcontroller. Any such SRAM cells which employ a floating gate transistor which can be programmed to provide the SRAM cell with a definitive asymmetry should avoid the added cost, size and complexity described above and should avoid the large barriers to electron tunneling or hot electron injection presented by the silicon oxide-silicon interface, 3.2 eV, which result in slow write and erase speeds even at very high electric fields. Likewise, the floating gate transistors need to avoid the combination of very high electric fields and damage by hot electron collisions in the which oxide result in a number of operational problems like soft erase error, reliability problems of premature oxide breakdown and a limited number of cycles of write and erase. Further, when using an interpoly dielectric insulator erase approach for the non-volatile component, the above mentioned problems of having a rough top surface on the polysilicon floating gate which results in, poor quality interpoly oxides, sharp points, localized high electric fields, premature breakdown and reliability problems must be avoided.

DOCUMENTS

S. R. Pollack and C. E. Morris, "Tunneling through gaseous oxidized films of $Al_2O_3$," Trans. AIME, Vol. 233, p. 497, 1965.

T. P. Ma et al., "Tunneling leakage current in ultrathin (<a4 nm) nitride/oxide stack dielectrics," IEEE Electron Device Letters, vol. 19, no. 10, pp. 388-390, 1998.

O. Kubaschewski and B. E. Hopkins, "Oxidation of Metals and Alloys", Butterworth, London, pp. 53-64, 1962.

J. M. Eldridge and J. Matisoo, "Measurement of tunnel current density in a Meal-Oxide-Metal system as a function of oxide thickness," Proc. $12^{th}$ Intern. Conf. on Low Temperature Physics, pp. 427-428, 1971.

J. M. Eldridge and D. W. Dong, "Growth of thin PbO layers on lead films. I. Experiment," Surface Science, Vol. 40, pp. 512-530, 1973.

J. H. Greiner, "Oxidation of lead films by rf sputter etching in an oxygen plasma", J. Appl. Phys., Vol. 45, No. 1, pp. 32-37, 1974.

J. M. Eldridge and J. Matisoo, entitled "Measurement of tunnel current density in a Meal-Oxide-Metal system as a function of oxide thickness," Proc. $12^{th}$ Intern. Conf. on Low Temperature Physics, pp. 427-428, 1971.

S. M. Sze, Physics of Semiconductor Devices, Wiley, N.Y., pp. 553-556, 1981.

G. Simmons and A. El-Badry, "Generalized formula for the electric tunnel effect between similar electrodes separated by a thin insulating film," J. Appl. Phys., Vol. 34, p. 1793, 1963.

S. R. Pollack and C. E. Morris, "Tunneling through gaseous oxidized films of $Al_2O_3$," Trans. AIME, Vol. 233, p. 497, 1965, Z. Hurych, "Influence of nonuniform thickness of dielectric layers on capacitance and tunnel currents," Solid-State Electronics, Vol. 9, p. 967, 1966.

S. P. S. Arya and H. P. Singh, "Conduction properties of thin $Al_2O_3$ films," Thin Solid Films, Vol. 91, No. 4, pp. 363-374, May 1982.

K.-H. Gundlach and J. Holzl, "Logarithmic conductivity of Al—$Al_2O_3$—Al tunneling junctions produced by plasma- and by thermal-oxidation", surface Science, Vol. 27, pp. 125-141, 1971.

J. Grimblot and J. M. Eldridge, "I. Interaction of Al films with $O_2$ at low pressures", J. Electro. Chem. Soc., Vol. 129, No. 10, pp. 2366-2368, 1982.

J. Grimblot and J. M. Eldridge, "II. Oxidation of Al films", ibid, 2369-2372, 1982.

J. M. Greiner, "Josephson tunneling barriers by rf sputter etching in an oxygen plasma," J. Appl. Phys., Vol. 42, No. 12, pp. 5151-5155, 1971.

O. Michikami et al., "Method of fabrication of Josephson tunnel junctions," U.S. Pat. No. 4,412,902, Nov. 1, 1983.

H. F. Luan et al., "High quality $Ta_2O_5$ gate dielectrics with $T_{ox,eq} < 10$ angstroms," IEDM Tech. Digest, pp. 141-144, 1999.

Hase et al., "Method of manufacturing an oxide superconducting film," U.S. Pat. No. 5,350,738, Sep. 27, 1994.

SUMMARY OF THE INVENTION

The above mentioned problems with conventional SRAM cells for memory devices and other problems are addressed by the present invention and will be understood by reading and studying the following specification. SRAM cells and memory devices are provided where at least one of the transistors in the cross coupled cell includes a novel floating gate transistor, e.g. a non-volatile memory component, which can be programmed to provide the SRAM cell with a definitive asymmetry so that the cell always starts in a particular state. In this manner, the cell can be used both as stand alone SRAM and for embedded SRAM in combination with a microcontroller. According to the teachings of the present invention, the non-volatile component includes a floating gate separated from a control gate by a metal oxide and/or low tunnel barrier interpoly insulator.

In one embodiment of the present invention, an SRAM cell includes a pair of cross coupled transistors. At least one of the cross coupled transistors includes a first source/drain region and a second source/drain region separated by a channel region in a substrate. A floating gate opposes the channel region and separated therefrom by a gate oxide. A control gate opposes the floating gate. The control gate is separated from the floating gate by a low tunnel barrier intergate insulator. And, the floating gate can be programmed by tunneling charge between the floating gate and the control gate to provide the SRAM cell with a definitive asymmetry so that the cell always starts in a particular state.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1A:
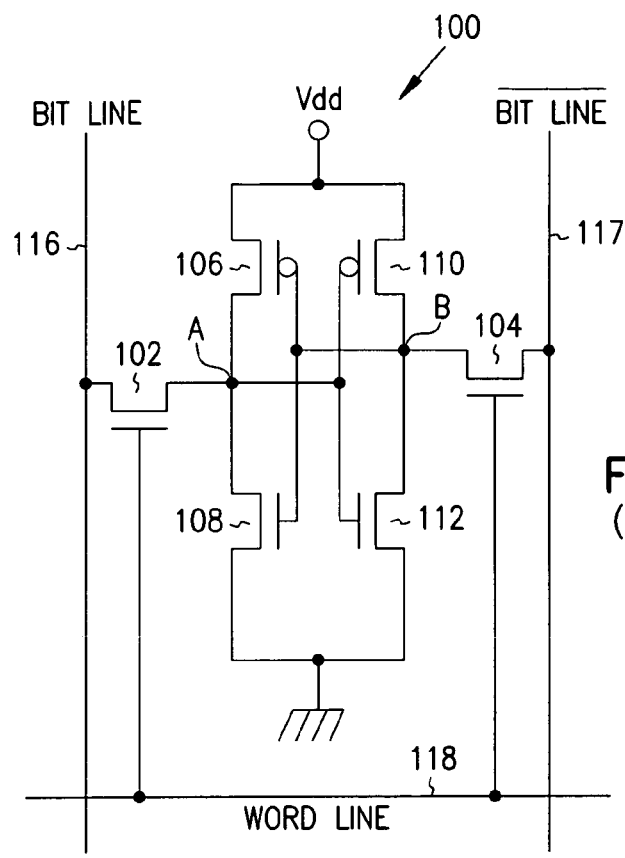
FIGS. 1A and 1B are circuit diagrams illustrating SRAM cells constructed in accordance with the prior art.
Figure 1B:
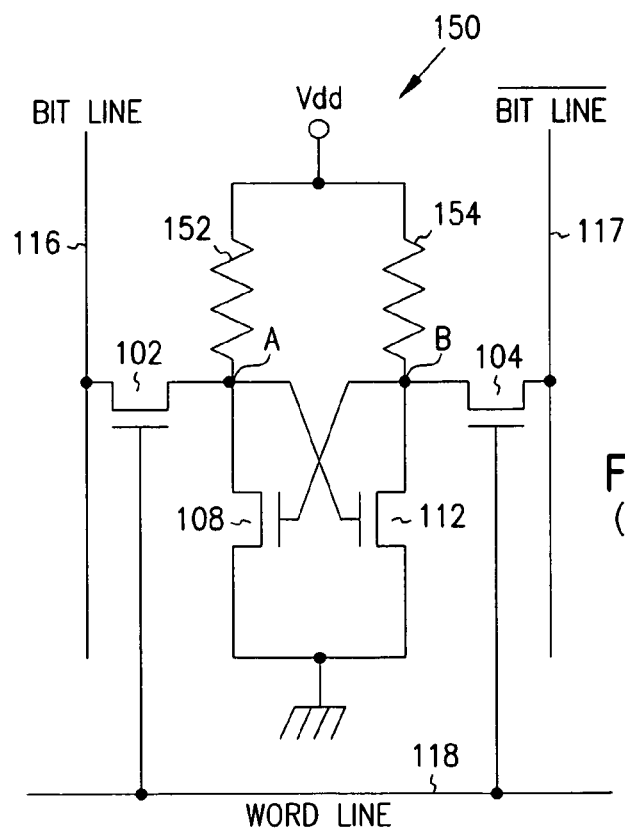
Figure 2:
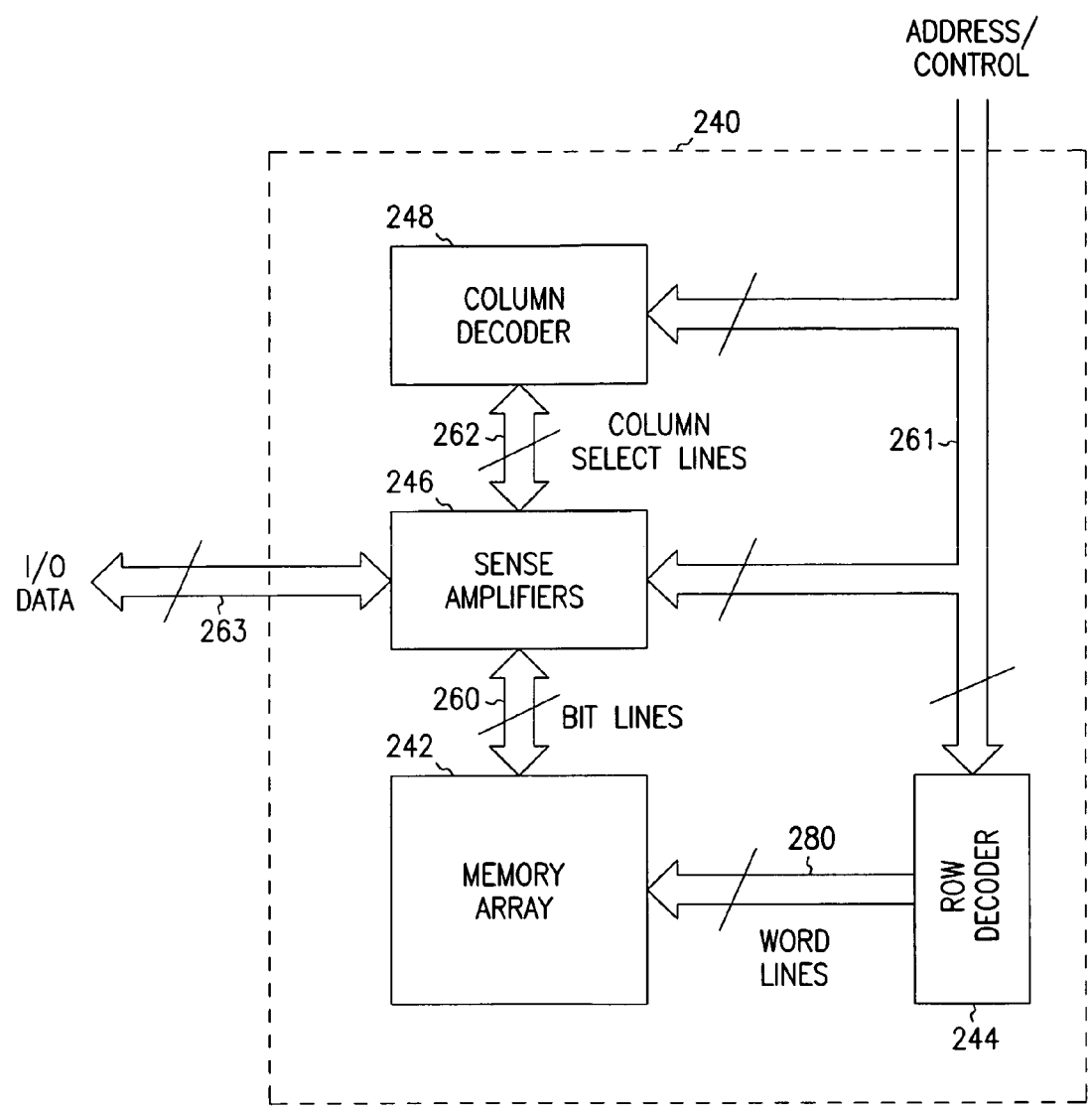
FIG. 2 is a block diagram illustrating a memory device such as can include SRAM cells.

FIG. 2 is a block diagram illustrating a memory device 240 such as can include SRAM cells. The memory device 240 contains a memory array 242, row and column decoders 244, 248 and a sense amplifier circuit 246. The memory array 242 can include a plurality of memory cells such as the SRAM cells 100 and 150 shown in FIG. 1. As shown in FIG. 2, the memory device includes word lines 280 and bit lines 260 which are commonly arranged into rows and columns, respectively. The bit lines 260 of the memory array 242 are connected to the sense amplifier circuit 246, while its word lines 280 are connected to the row decoder 244. Address and control signals are input on address/control lines 261 into the memory device 240 and connected to the column decoder 248, sense amplifier circuit 246 and row decoder 244 and are used to gain read and write access, among other things, to the memory array 242.

The column decoder 248 is connected to the sense amplifier circuit 246 via control and column select signals on column select lines 262. The sense amplifier circuit 246 receives input data destined for the memory array 242 and outputs data read from the memory array 242 over input/output (I/O) data lines 263. Data is read from the cells of the memory array 242 by activating a word line 280 (via the row decoder 244), which couples all of the memory cells corresponding to that word line to respective bit lines 260, which define the columns of the array. One or more bit lines 260 are also activated. When a particular word line 280 and bit lines 260 are activated, the sense amplifier circuit 246 connected to a bit line column detects and amplifies the data bit transferred from the memory cell to its bit line 260 by measuring the potential difference between the activated bit line 260 and a reference line which may be an inactive bit line. The operation of such sense amplifiers will be known and understood by one of ordinary skill in the art upon reading this disclosure.

Figure 3:
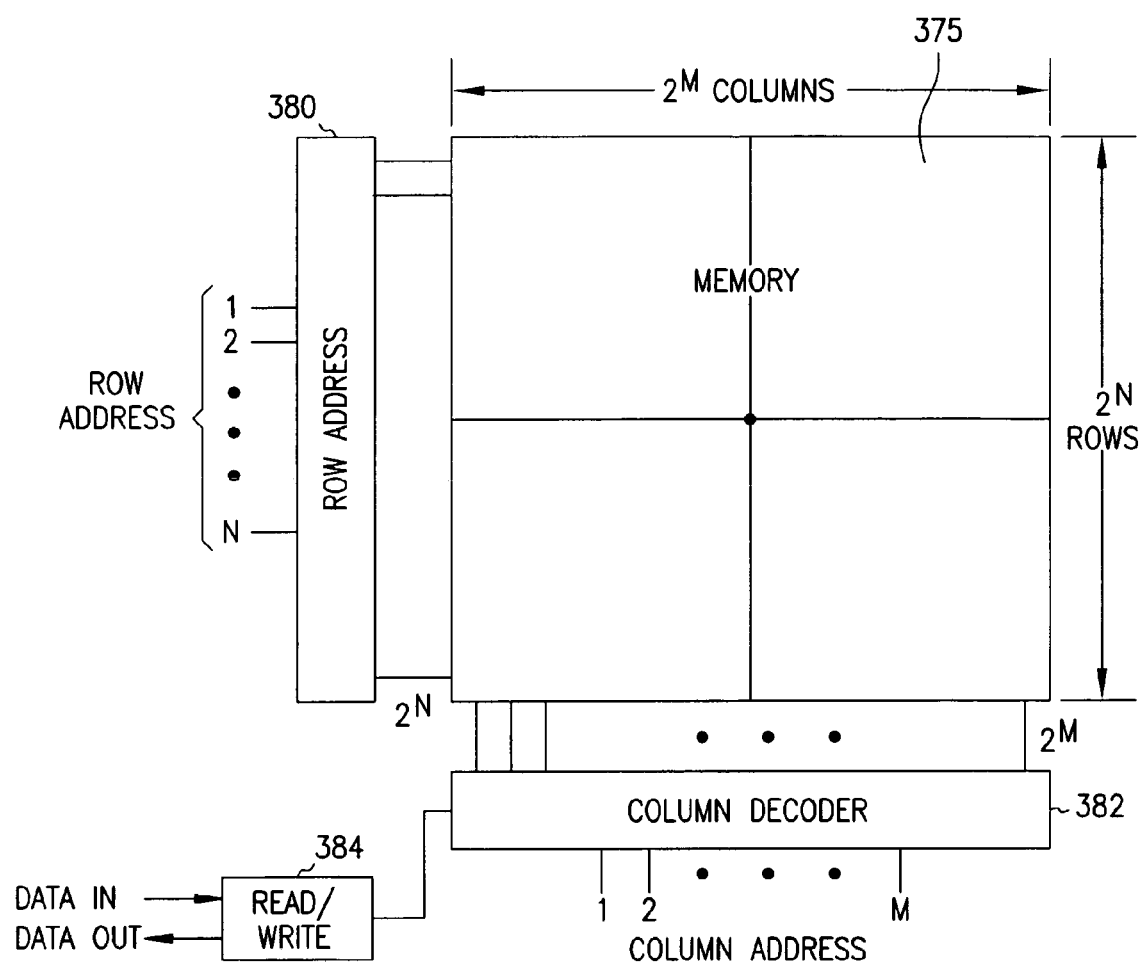
FIG. 3 is a block diagram of another embodiment of a memory device such as can include SRAM cells.

FIG. 3 is a block diagram of another embodiment of a memory device such as can include SRAM cells. As stated above, memory cells 100 and 150 of either embodiment shown in FIGS. 1A and 1B can be embedded in an array of similar cells as shown in FIG. 3. A typical memory array consists of a matrix of storage bits with bit capacity $2^N \times 2^M$ bits arranged in an array 375 with $2^M$ columns (bit lines) and $2^N$ rows (word lines).

To read data stored in the array 375, a row address is input and decoded by row decoder 380 to select one of the rows or word lines. All of the cells along this word line are activated. Column decoder 382 then addresses one bit out of the $2^M$ bits that have been activated and routes the data that is stored in that bit to a sense amplifier (not shown) and then out of the array 375. Data in and Data out are controlled by the Read/Write Control circuit 384.

The present invention, describes the use of a cross coupled SRAM cell where at least one of the transistors in the cross coupled cell includes a novel floating gate transistor, e.g. non-volatile memory component as described below, which can be programmed to provide the SRAM cell with a definitive asymmetry so that the cell always starts in a particular state. In this manner, the cell can be used both stand alone SRAM and for embedded SRAM in combination with a microcontroller. The typical application would, in fact, want to be user field or in service programmable with different nonvolatile data patterns stored for each user. One usage for the present invention is to replace a boot ROM, but other applications could be to store data that can be updated or over written later. In other words the cell can be programmed to always start with either a "zero" or "one" stored in the cell and the information used for start-up instructions. This built in asymmetry has no effect upon normal operation of the cell as an SRAM. In these cases large asymmetries are written into the cell by programming it by holding either node voltage, V1, or V2, at ground or a low voltage.

Figure 4:
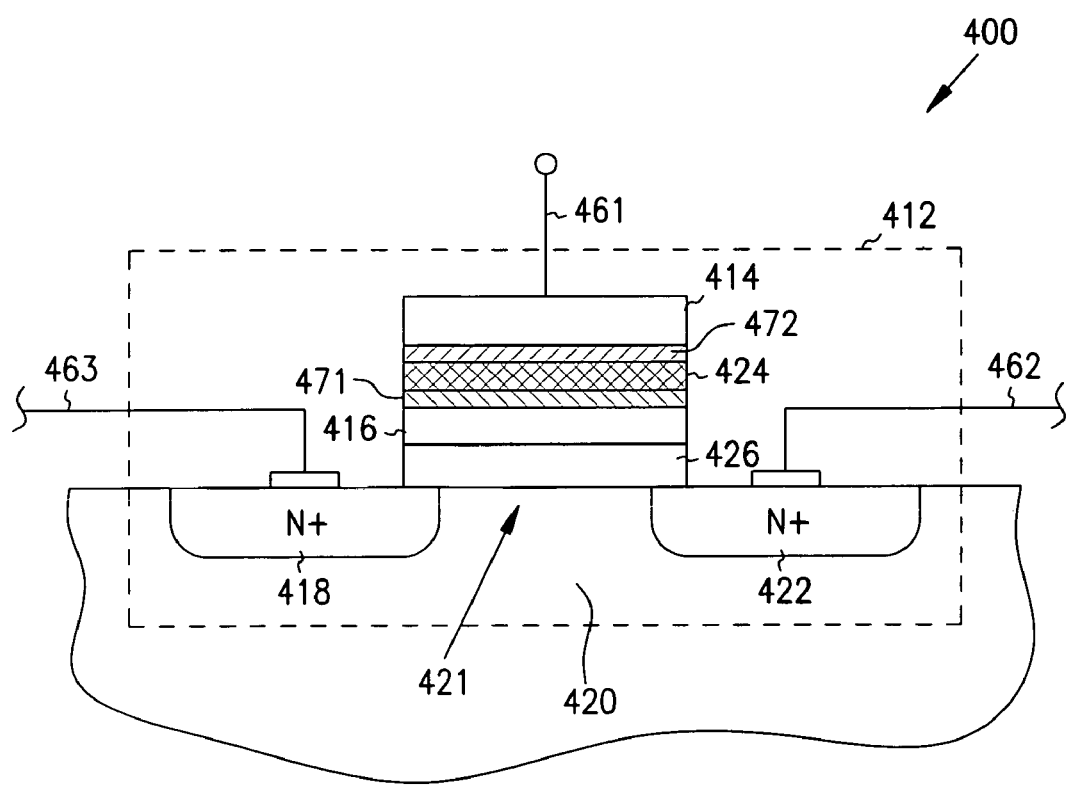
FIG. 4 illustrates a novel memory cell constructed in accordance with the present invention and suited for use in SRAM cells of the invention.

According to the teachings of the present invention, the non-volatile memory component includes a low tunnel barrier intergate, or interpoly, insulator between the control gate and the floating gate. An example is shown in FIG. 4. According to the teachings of the present invention. According to the teachings of the present invention, the low tunnel barrier intergate insulator can include aluminum oxide, transition metal oxides, and perovskite oxide tunnel barriers, and others of the like, between the floating gate and control gate. An example for these metal oxide intergate insulators has been described in detail in the copending, co-filed application entitled, "Flash Memory with Low Tunnel Barrier Interpoly Insulators," Ser. No. 09/945,507. The use of metal oxide films for this purpose offer a number of advantages including:

(i) Flexibility in selecting a range of smooth metal film surfaces and compositions that can be oxidized to form tunnel barrier insulators.

(ii) Employing simple "low temperature oxidation" to produce oxide films of highly controlled thickness, composition, purity and uniformity.

(iii) Avoiding inadvertent inter-diffusion of the metal and silicon as well as silicide formation since the oxidation can be carried out at such low temperatures.

(iv) Using metal oxides that provide desirably lower tunnel barriers, relative to barriers currently used such as $SiO_2$.

(v) Providing a wide range of higher dielectric constant oxide films with improved capacitance characteristics.

(vi) Providing a unique ability to precisely tailor tunnel oxide barrier properties for various device designs and applications.

(vii) Permitting the use of thicker tunnel barriers, if needed, to enhance device performance and its control along with yield and reliability.

(viii) Developing layered oxide tunnel barriers by oxidizing layered metal film compositions in order, for example, to enhance device yields and reliability more typical of single insulating layers.

(ix) Eliminating soft erase errors caused by the current technique of tunnel erase from floating gate to the source.

FIG. 4 illustrates a novel memory cell device 400 constructed in accordance with the present invention and suited for use in SRAM cells of the invention as described in connection with FIGS. 5A-5C below. As shown in FIG. 4, the memory cell 400 includes a first source/drain region 418 and a second source/drain region 422 separated by a channel region 421 in a substrate 420. A floating gate 416 opposes the channel region 421 and is separated therefrom by a gate oxide 426. A control gate 414 opposes the floating gate 416. According to the teachings of the present invention, the control gate 414 is separated from the floating gate 416 by a low tunnel barrier intergate insulator 424.

In one embodiment of the present invention, low tunnel barrier intergate insulator 424 includes a metal oxide insulator selected from the group consisting of lead oxide (PbO) and aluminum oxide ($Al_2O_3$). In an alternative embodiment of the present invention, the low tunnel barrier intergate insulator 424 includes a transition metal oxide and the transition metal oxide is selected from the group consisting of $Ta_2O_5$, $TiO_2$, $ZrO_2$, and $Nb_2O_5$. In still another alternative embodiment of the present invention, the low tunnel barrier intergate insulator 424 includes a Perovskite oxide tunnel barrier.

According to the teachings of the present invention, the floating gate 416 includes a polysilicon floating gate 416 having a metal layer 471 formed thereon in contact with the low tunnel barrier intergate insulator 424. Likewise, the control gate 414 includes a polysilicon control gate 414 having a metal layer 472 formed thereon in contact with the low tunnel barrier intergate insulator 424. In one embodiment of the invention, the metal layers, 471 and 472, are formed of the same metal material used to form the metal oxide interpoly insulator 424.

As shown in FIG. 4, a control gate line 461 is coupled to the control gate 414. Electrical connections are also made to the first and the second source/drain regions, 418 and 422, via lines 462 and 463 respectively. In one embodiment line 462 can couple the first source/drain region 418 to either a ground potential or a power supply potential Vdd. Likewise, in one embodiment line 462 can couple the second source/drain region 422 to a bitline node. As one of ordinary skill in the art will understand upon reading this disclosure, the above described orientation is provided by illustration only and can be reversed. The invention is not so limited.

Figure 5A:
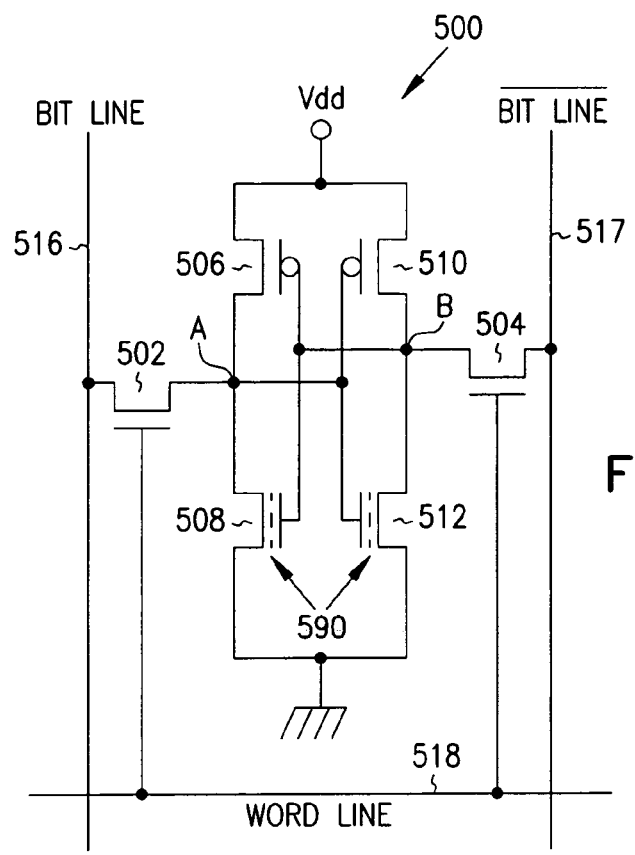
FIGS. 5A, 5B and 5C are circuit diagrams illustrating SRAM cells constructed in accordance with the present invention using the novel memory cell of FIG. 4.
Figure 5B:
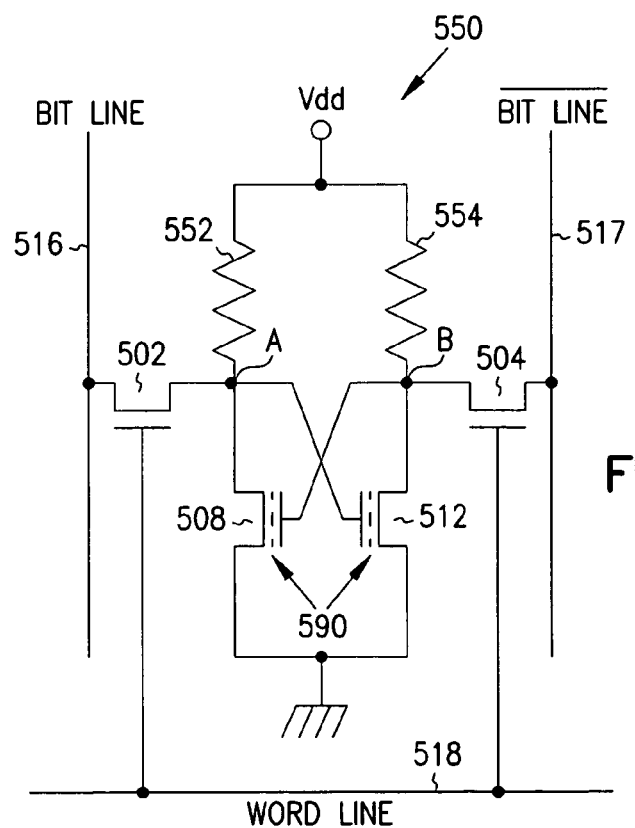
Figure 5C:
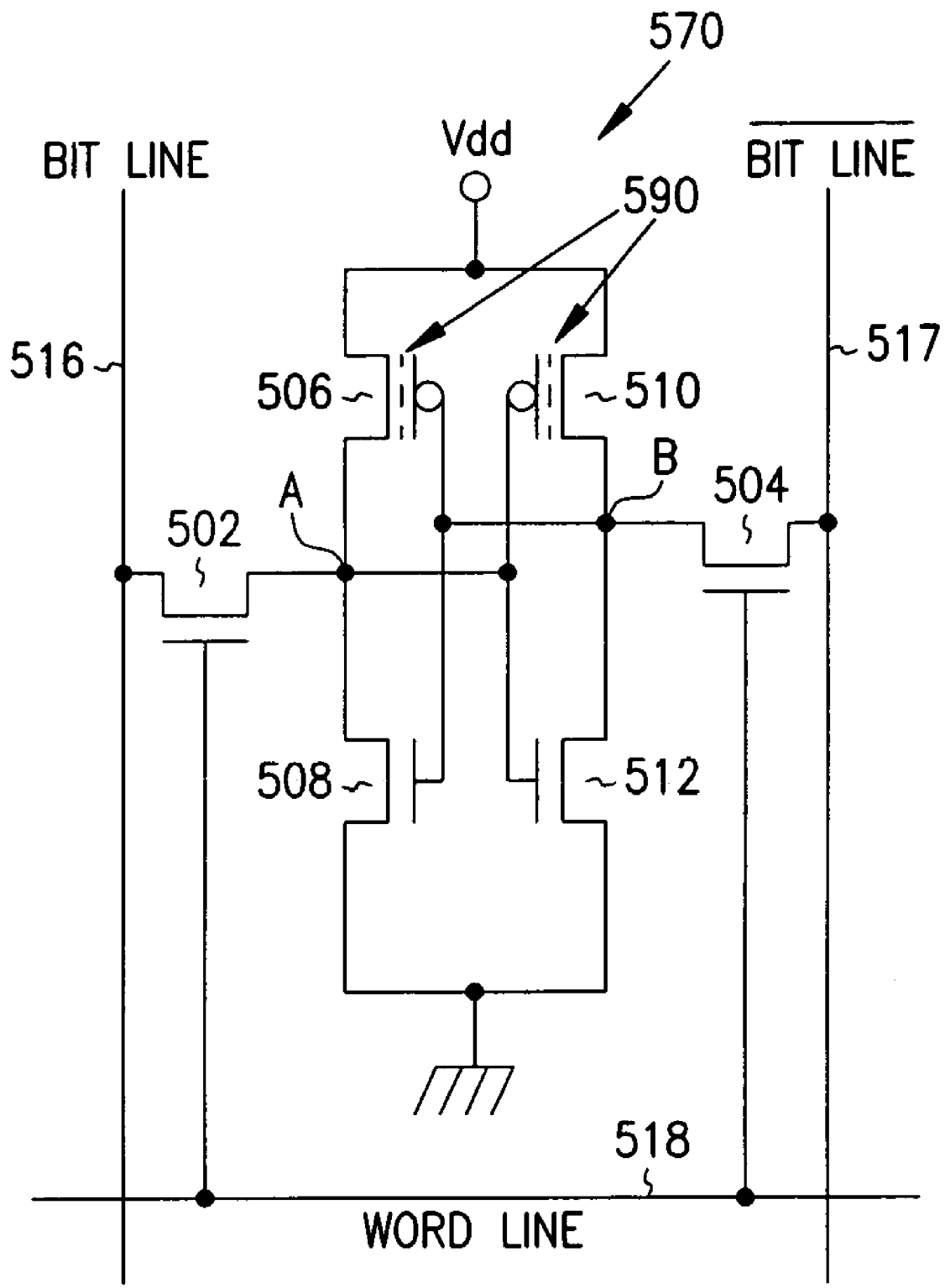

FIGS. 5A, 5B and 5C are circuit diagrams illustrating SRAM cells constructed in accordance with the present invention using the novel memory cell of FIG. 4. That is, FIGS. 5A, 5B and 5C illustrate the implementation of the novel memory cell of FIG. 5 into a number of different embodiments for SRAM cells, e.g. 500, 550, and 570, according to the teachings of the present invention. The cells 500, and 550 are similar to the cells 100 and 150 illustrated in FIGS. 1A and 1B with the exception that different transistors 508, 512 replace the transistors 108 and 112 from FIGS. 1A and 1B. According to the teachings of the present invention, the transistors 508, 512 are transistors having a control gate and a floating gate as explained and described in detail in connection with FIG. 4. As will be described below, the use of the transistors 508, 512 allows the cells 500, 550 of the present invention to be operated as either a conventional SRAM cell or as a nonvolatile memory cell (i.e., a SRAM with repressed memory).

FIG. 5C illustrates a novel alternate embodiment for an SRAM cell using the novel memory cell of FIG. 4 according to the teachings of the present invention. In FIG. 5C, the novel memory cell of FIG. 5 is formed as a PMOS transistor rather than as the NMOS transistors employed in the SRAM cells of FIGS. 5A and 5B. That is, in FIG. 5C the SRAM cell 570 includes a pair of cross coupled PMOS transistors 506 and 510 formed according to the teachings of the present invention within the cross coupled SRAM cell 570.

The operation of the SRAM cells of FIGS. 5A and 5B is explained as follows. When the cells 500, 550 are to be accessed as SRAM cells, information may be written to and read from the cells 500, 550 as described above with reference to FIGS. 1A and 1B. That is, data is stored with either a high potential at node A and a low potential at node B, or a low potential at node A and a high potential at node B. Similarly, the logic state of the SRAM cells 500, 550 is read by sensing the cell current on a bit line pair comprised of bit lines 516 and 517 and/or the differential voltage developed thereon. If the cells 500, 550 are in logic state "1," node A is high and node B is low. If the cells 500, 550 are in logic state "0," the reverse is true with node A low and node B high.

For the cells 500, 550 to be used as nonvolatile memory in a programmed state, e.g. PROM, EAPROM, or EEPROM, one of the transistors 508, 512 has to be programmed to the first charge state, while the other transistor has to be programmed to the second charge state. For example, to place the cells 500, 550 into logic state "1," e.g., node A high, node B low, transistor 508 must be programmed into the first charge state and transistor 512 into the second charge state. This raises the resistance of transistor 508, making it less conductive and causing node A to be high, while node B goes low. Similarly, to place the cells 500, 550 into logic state "0," e.g., node A low, node B high, transistor 512 must be programmed into the first charge state and transistor 508 into the second charge state. This raises the resistance of transistor 512, making it less conductive and causing node B to be high, while node A goes low.

The floating gates 590 of transistors 508 and 512 are programmed with the tunnel-tunnel mode technique. In one embodiment, the floating gates 590 of transistors 508 and 512 can be programmed using conventional hot electron channel injection. That is, a tunnel mode is used to transfer electrons from the source to the floating gates of the transistors 508, 512 to program the gates 590 and the transistors 508, 512 to the first charge state (i.e., tunnel write operation). This first charge state is referred to herein as the tunnel write operation.

Referring to FIG. 4, write can be achieved by the normal channel hot electron injection and gate current through the gate silicon oxide 426 to the floating gate 416. This is done by selecting a particular column by applying a high control gate voltage and applying relatively large drain voltage as is done with conventional ETOX flash memory devices. However, according to the teachings of the present invention, write can also be accomplished by applying a positive voltage to the substrate 420 or well select line and a large negative voltage to the control gates 414, electrons will tunnel from the control gate 414 to the floating gate 416. The low tunnel barrier 424 will provide an easy write operation and the selection of the substrate 420 or well bias will provide selectivity and address only one device. It should be noted that a negative charge on the floating gate 416, referred to herein as the "first charge state," can be associated with either a logic "0" or "1" and that the invention is not limited to any particular association between the first charge state and a particular logic value. The one requirement is that the program, erase and sensing circuitry used to access the nonvolatile portion of the cells 500 and 550 associate the first charge state to the same logic value.

According to the teachings of the present invention, a tunnel mode is used to transfer the electrons from the floating gate 416 to the control gate 414 to program the transfer device 412, e.g. the floating gate 416 and thus the nonvolatile portion of the cells 500 and 550, to a second charge state. The second charge state is referred to herein as the tunnel erase operation. According to the teachings of the present invention, the tunnel erase operation is achieved by driving the floating gate 416, through the control gate 414 and word line 461, with a large positive voltage. That is, according to the teachings of the present invention, erase is achieved by providing a negative voltage to the substrate 420 or well address line and a large positive voltage to the control gate 414. This causes electrons to tunnel off of the floating gate 416 on to the control gate 414. A whole row can be erased by addressing all the column lines along that row and a block can be erased by addressing multiple row back gate or substrate/well 420 address lines.

The operation of the SRAM cell of FIG. 5C is explained as follows. When cell 570 is to be accessed as an SRAM cell, information may be written to and read from cell 570 is the reverse manner from that described above in connection with FIGS. 3A and 3B. Data is again stored with either a high potential at node A and a low potential at node B, or a low potential at node A and a high potential at node B. Similarly, the logic state of SRAM cell 570 is read by sensing the cell current on a bit line pair comprised of bit lines 516 and 517 and/or the differential voltage developed thereon. If the cell 570 is in logic state "1," node A is high and node B is low. If the cell 570 is in logic state "0," the reverse is true with node A low and node B high.

For the cell 570 to be used as nonvolatile memory, e.g. PROM, EAPROM, or EEPROM, one of the transistors 506, 510 has to be programmed to the first charge state, while the other transistor has to be programmed to the second charge state. For example, to place the cell 570 into logic state "1," e.g., node A high, node B low, transistor 506 must be programmed into the first charge state and transistor 510 into the second state. This lowers the resistance of transistor 506, making it more conductive and causing node A to be high, while node B goes low. Similarly, to place the cell 570 into logic state "0," e.g., node A low, node B high, transistor 510 must be programmed into the first charge state and transistor 506 into the second charge state. This lowers the resistance of transistor 510, making it more conductive and causing node B to be high, while node A goes low.

According to the teachings of the present invention, and referring to FIG. 4, write can be accomplished by applying a positive voltage to the substrate 420 or well select line and a large negative voltage to the control gates 414, electrons will tunnel from the control gate 414 to the floating gate 416. The low tunnel barrier 424 will provide an easy write operation and the selection of the substrate or well 420 bias will provide selectivity and address only one device. It should be noted that a negative charge on the floating gate 416, referred to herein as the "first charge state," can be associated with either a logic "0" or "1" and that the invention is not limited to any particular association between the first charge state and a particular logic value. The one requirement is that the program, erase and sensing circuitry used to access the nonvolatile portion of the cell 570 associate the first charge state to the same logic value.

According to the teachings of the present invention, a tunnel mode is used to transfer the electrons from the floating gate 416 to the control gate 414 to program the transfer device 412, e.g. the floating gate 416 and thus the nonvolatile portion of the cell 570, to a second charge state. The second charge state is referred to herein as the tunnel erase operation. According to the teachings of the present invention, the tunnel erase operation is achieved by driving the floating gate 416, through the control gate 414 and word line 461, with a large positive voltage. That is, according to the teachings of the present invention, erase is achieved by providing a negative voltage to the substrate or well 420 address line and a large positive voltage to the control gate 414. This causes electrons to tunnel off of the floating gate 416 on to the control gate 414. A whole tow can be erased by addressing all the column lines along that row and a block can be erased by addressing multiple row back gate or substrate/well 420 address lines.

As shown in FIGS. 5A-5C, read is accomplished as in conventional SRAM cell memory devices. A column line is addressed by applying a wordline 518 voltage and sensing the current along the data bit or drain row address line, e.g. 516 and 517.

It should be noted that the lack of a negative charge on the floating gate, shown as 590 in FIGS. 5A-5C, referred to herein as the "second charge state," can be associated with either a logic "0" or "1" and that the invention is not limited to any particular association between the second charge state and a particular logic value. The one requirement is that the program, erase and sensing circuitry used to access the nonvolatile portion of the cell, e.g. 500, 550, and 570, associate the second charge state to the same logic value and that the logic value be different than the value chosen for the first charge state.

When the SRAM cells 500, 550 and 570 are programmed in this manner upon start-up and/or when power supply voltage is first applied to the cells they will always start in one preferred state with either a logic state "0" or a logic state "1" stored in the cell. The use of the SRAM cells 500, 550 and 570 in this manner is particularly useful for start-up conditions and the saving and/or restoring of the state of a central processing unit (CPU) that is executing software instructions in a protected mode of operation. Moreover, these SRAM cells 500, 550 and 570 can be used instead of the typical ROM devices used for start-up.

According to the teachings of the present invention, SRAM cells 500, 550, and 570, as shown in FIGS. 5A, 5B and 5C can be embedded in an array of similar cells as shown in FIGS. 2 and 3. As described in connection with FIG. 3, a typical memory array consists of a matrix of storage bits with bit capacity $2^N \times 2^M$ bits arranged in an array 375 with $2^M$ columns (bit lines) and $2^N$ rows (word lines).

To read data stored in the array 375, a row address is input and decoded by row decoder 380 to select one of the rows or word lines. All of the cells along this word line are activated. Column decoder 382 then addresses one bit out of the $2^M$ bits that have been activated and routes the data that is stored in that bit to a sense amplifier (not shown) and then out of the array 375. Data in and Data out are controlled by the Read/Write Control circuit 384.

As discussed above in connection with FIG. 4 and FIGS. 5A, 5B and 5C, the novel memory cell of the present invention can be operated as a SRAM and a nonvolatile memory and is suitable for use in the SRAM cells 500, 550 and 570 in many applications and systems that require both SRAM and nonvolatile memory. Examples include a fault tolerant system, start-up conditions, the saving and/or restoring of the state of a central processing unit (CPU) that is executing software instructions in a protected mode of operation, and shadow memory applications. Further, the SRAM cells 500, 550 and 570 can be used in an array such as the array 242 within the SRAM device 240 illustrated in FIG. 2 or it can be used as a separate special purpose memory if so desired. Moreover, a memory device such as the device 240 illustrated in FIG. 2 can contain an array 242 having conventional SRAM cells and SRAM cells with repressed memory constructed in accordance with the present invention.

Figure 6A:
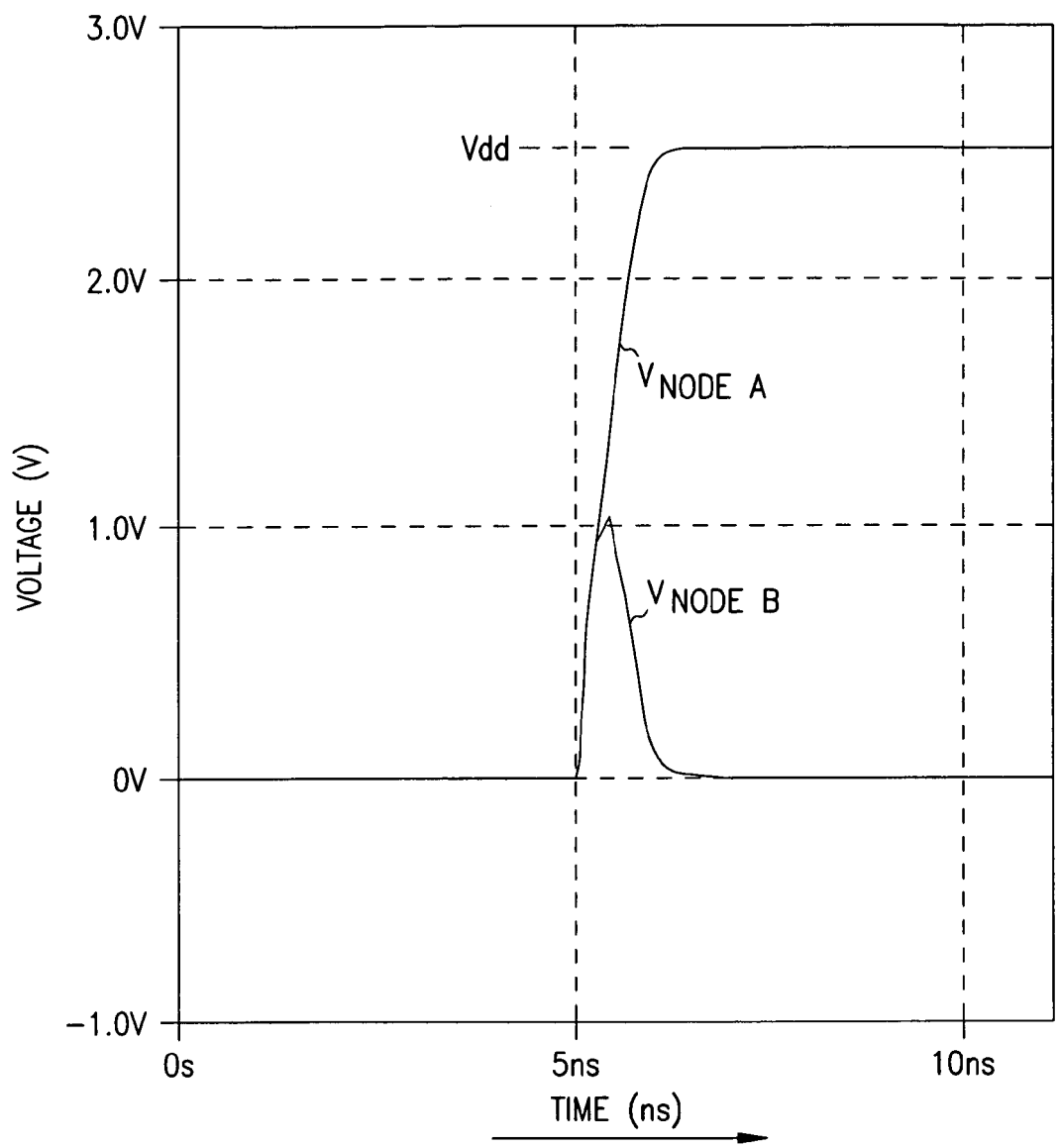
FIG. 6A illustrates is a graph of voltage versus time illustrating the output of an SRAM cell according to one embodiment of the present invention.
Figure 6B:
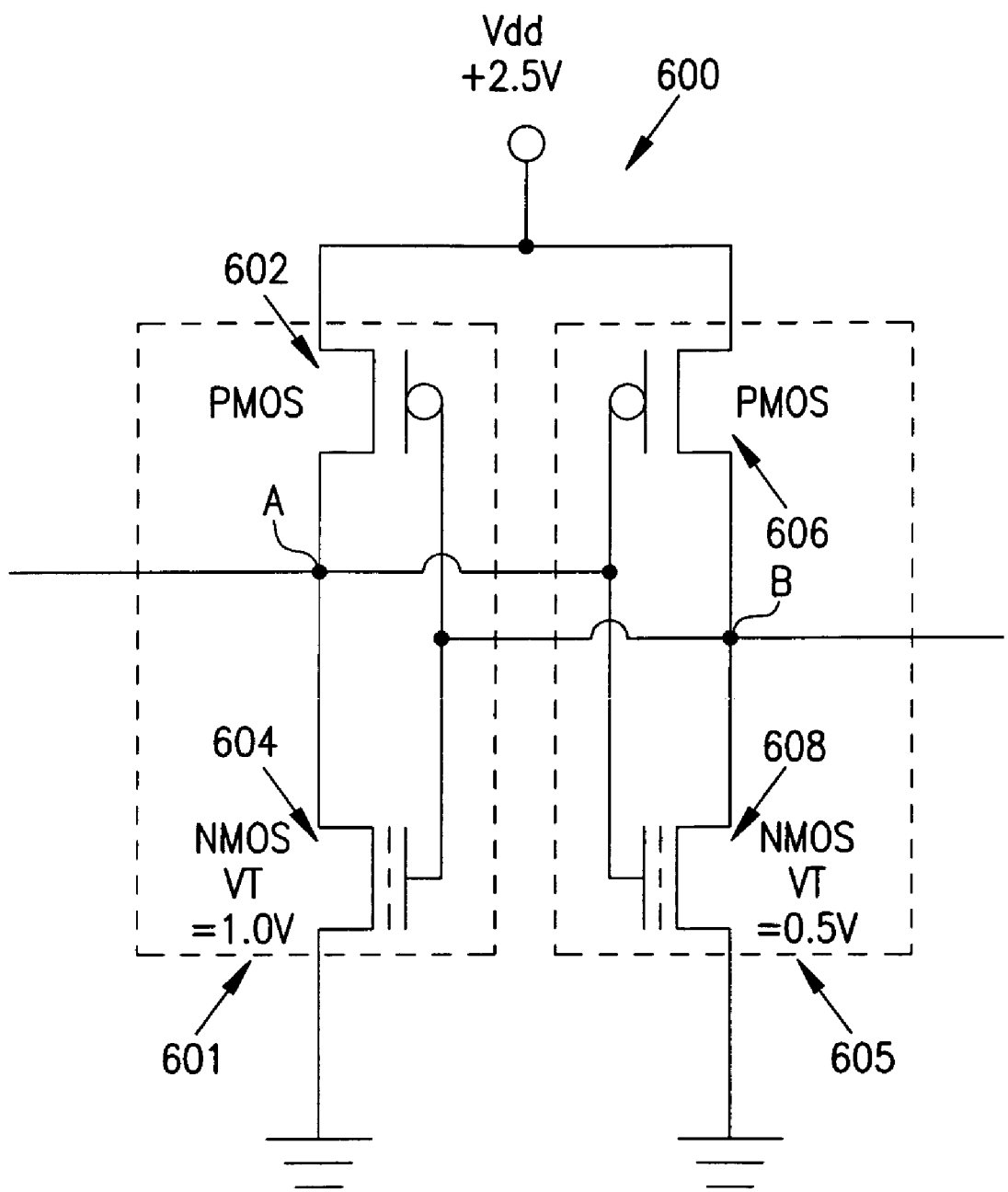
FIG. 6B is a circuit diagram of an embodiment of an SRAM cell, such as the SRAM cell shown in FIG. 5A, having novel NMOS transistors in the cross coupled cell constructed in accordance with FIG. 4, where a difference in threshold voltage has been programmed into the novel NMOS transistors.

FIG. 6A illustrates is a graph of voltage versus time illustrating the output of the SRAM cell of FIG. 6B, having novel NMOS transistors in the cross coupled cell constructed in accordance with FIG. 4, where a difference in threshold voltage has been programmed into the novel NMOS transistors.

FIG. 6B is analagous to the SRAM embodiment shown in FIG. 5A. As shown in FIG. 6B, the SRAM cell 600 includes a pair of cross coupled inverters. First inverter 601 includes a PMOS transistor 602 and an NMOS floating gate transistor 604 formed according to the teachings of the present invention. Second inverter 605 includes a PMOS transistor 606 and an NMOS floating gate transistor 608 formed according to the teachings of the present invention. That is, the NMOS transistors, 604 and 608, include NMOS transistors having a floating gate separated from a control gate by a low tunnel barrier intergate insulator. Thus, according to the teachings of the present invention, the NMOS transistors can be programmed by tunneling charge between the floating gate and the control gate as described in detail above. In this embodiment, floating gate NMOS transistor 604 has been programmed according to the teachings of the present invention with a charge present on its floating gate, e.g. is programmed in a first state. Floating gate NMOS transistor 608 has not been programmed with a charge on its floating gate, e.g. is programmed in a second state. Accordingly, floating gate NMOS transistor 604 is more resistive, and less conductive. Likewise, floating gate NMOS transistor 608 is more conductive driving node A high and driving node B low. This is also indicated in FIG. 6B where it is shown that floating gate NMOS transistor 604 has a threshold voltage, Vt, of 1.0 Volts and that floating gate NMOS transistor 608 has a threshold voltage, Vt, of 0.5 Volts. It should be noted that these voltage threshold representations are provided by way of example and not by way of limitation for illustrating the manner in which NMOS transistors 604 and 608 can be programmed, according to the teachings of the present invention, to have a defined asymmetry for the SRAM cell 600.

As shown in the graph of FIG. 6A, transistor 608 turns on more quickly since it possesses the lower threshold voltage, Vt. This causes the node voltage B to be lower than normal and the cell to switch and start up in a state with node voltage, B, low. In other words the cell can be programmed to always start with either a "zero" or "one" stored in the cell and the information used for start-up instructions.

This built in asymmetry has no effect upon normal operation of the cell as an SRAM. In these cases large asymmetries are written into the cell by programming it holding either node voltage, A or B, at ground or a low voltage. Thus, according to the teachings of the present invention, SRAM cell 600 can be used for both stand alone SRAM and for embedded SRAM in combination with a microcontroller. The typical application would, in fact, want to be user field or in service programmable with different nonvolatile data patterns stored for each user.

As one of ordinary skill in the art will understand upon reading this disclosure, the SRAM cells of the present invention include novel, floating gate programmable transistors which can be used in the NMOS active transistors 508 and 512 of a 6 transistor SRAM cell 500 as shown in FIG. 5A or as PMOS pull up devices 506 and 510 in of a 6 transistor SRAM cell 570, as shown in FIG. 5C. According to the teachings of the present invention, in the embodiment of FIG. 5C, the charge programmed onto a floating gate of the pull up devices 506 and 510 can be a lot "weaker" and still function appropriately.

One of ordinary skill in the art will understand upon reading this disclosure that 6 transistor cells offer the advantage of lower power dissipation, but consume more chip surface area.

Hence, in another embodiment of the present invention, a 4-transistor cell 550 is included which offers higher density. In this embodiment, the NMOS transistors 508 and 512 are made programmable according to the teachings of the present invention.

Figure 7A:
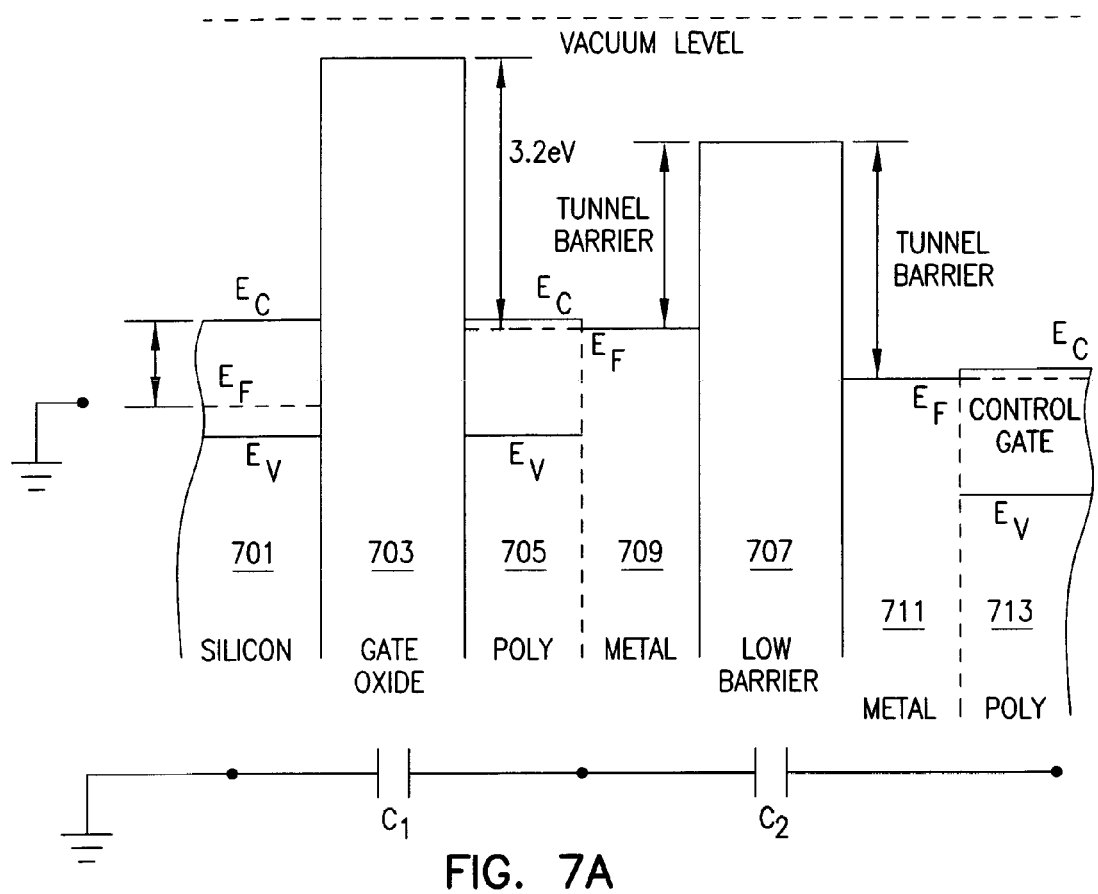
FIG. 7A is an energy band diagram illustrating the band structure at vacuum level with the low tunnel barrier interpoly insulator according to the teachings of the present invention.

FIG. 7A shows the band structure of the silicon substrate, e.g. channel region 701, silicon dioxide gate insulator, e.g. gate oxide 703, polysilicon floating gate 705, the low tunnel barrier interpoly dielectric 707, between metal plates 709 and 711, and then the polysilicon control gate 713, according to the teachings of the present invention.

The design considerations involved are determined by the dielectric constant, thickness and tunneling barrier height of the interpoly dielectric insulator 707 relative to that of the silicon dioxide gate insulator, e.g. gate oxide 703. The tunneling probability through the interpoly dielectric 707 is an exponential function of both the barrier height and the electric field across this dielectric.

Figure 7B:
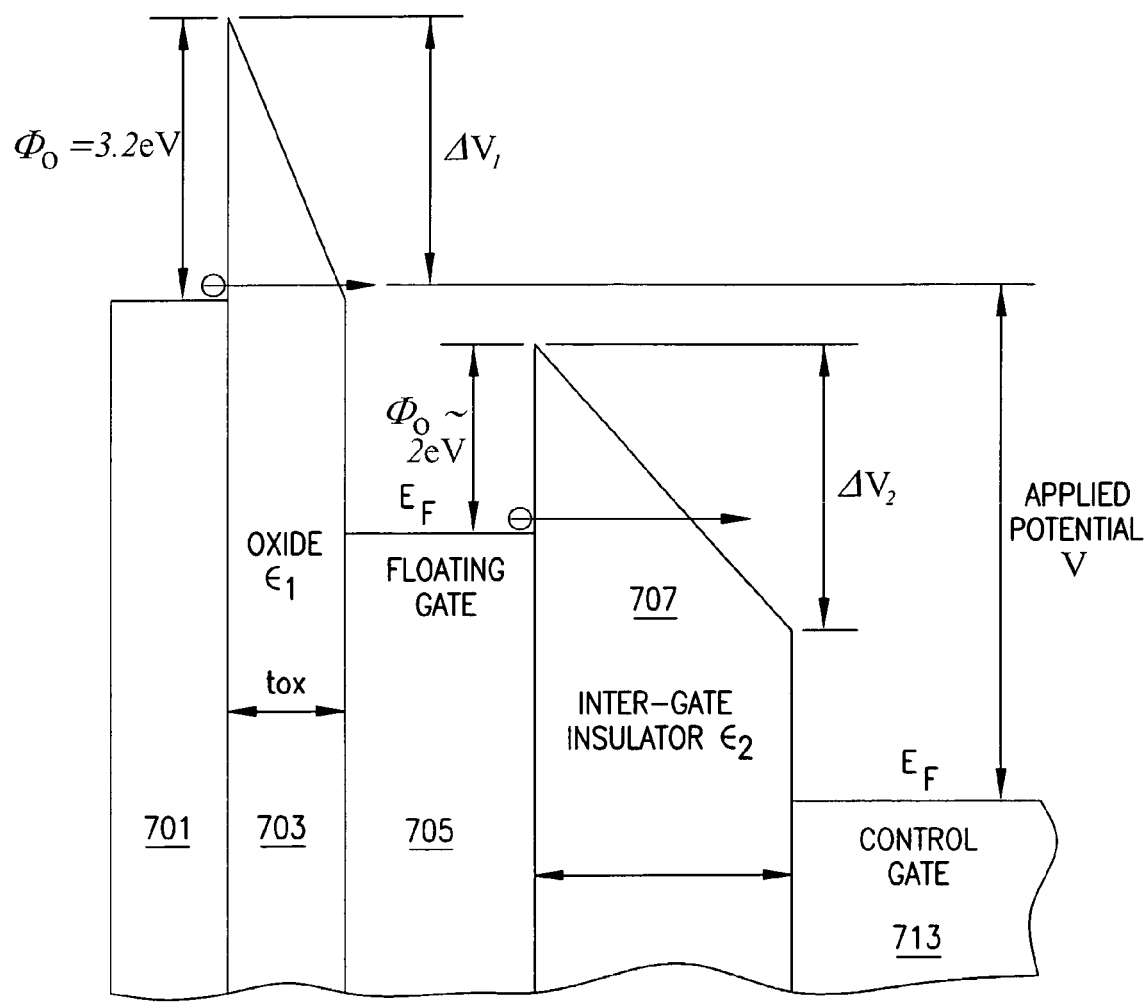
FIG. 7B is an energy band diagram illustrating the band structure during an erase operation of electrons from the floating gate to the control gate across the low tunnel barrier interpoly insulator according to the teachings of the present invention.

FIG. 7B is an energy band diagram illustrating the band structure during an erase operation of electrons from the floating gate 705 to the control gate 713 across the low tunnel barrier interpoly insulator 707 according to the teachings of the present invention. FIG. 7B is similarly useful in illustrating the reduced tunnel barrier off of the floating gate 705 to the control gate 713 and for illustrating the respective capacitances of the structure in the non-volatile memory component according to the teachings of the present invention.

As shown in FIG. 7B, the electric field is determined by the total voltage difference across the structure, the ratio of the capacitances (see FIG. 7A), and the thickness of the interpoly dielectric 707.

$$t_{ig} = \frac{\epsilon_2 \, tox}{\epsilon_1}$$

The voltage across the interpoly dielectric 707 will be, $\Delta V2 = V\, C1/(C1+C2)$, where $\Delta V$ is the total applied voltage. The capacitances, C, of the structures depends on the dielectric constant, $\epsilon_r$, the permittivity of free space, $\epsilon_o$, and the thickness of the insulating layers, t, and area, A, such that $C = \epsilon_r \epsilon_o A/t$, Farads/cm$^2$. The electric field across the interpoly dielectric insulator 707, having capacitance, C2, will then be $E2 = \Delta V2/t2$, where t2 is the thickness of this layer.

The tunneling current in erasing charge from the floating gate 705 by tunneling to the control gate 713 will then be as shown in FIG. 7B given by an equation of the form:

$$J = B\exp(-Eo/E)$$

$$J = \frac{q^2 E^2}{4\pi h \Phi} e^{-Eo/E} \quad Eo = \frac{8\pi}{3} \frac{\sqrt{2mq^*} \, \Phi^{3/2}}{h}$$

where E is the electric field across the interpoly dielectric insulator 707 and Eo depends on the barrier height. Practical values of current densities for aluminum oxide which has a current density of 1 A/cm$^2$ at a field of about $E = 1V/20 \text{\AA} = 5 \times 10^{+6}$ V/cm are evidenced in a description by Pollack. Practical current densities for silicon oxide transistor gate insulators which has a current density of 1 A/cm$^2$ at a field of about $E = 2.3V/23 \text{\AA} = 1 \times 10^{+7}$ V/cm are evidenced in a description by T. P. Ma et al.

The lower electric field in the aluminum oxide interpoly insulator 707 for the same current density reflects the lower tunneling barrier of less than 2 eV, shown in FIG. 7B, as opposed to the 3.2 eV tunneling barrier of silicon oxide 703, also illustrated in FIG. 7B.

Figure 7C:
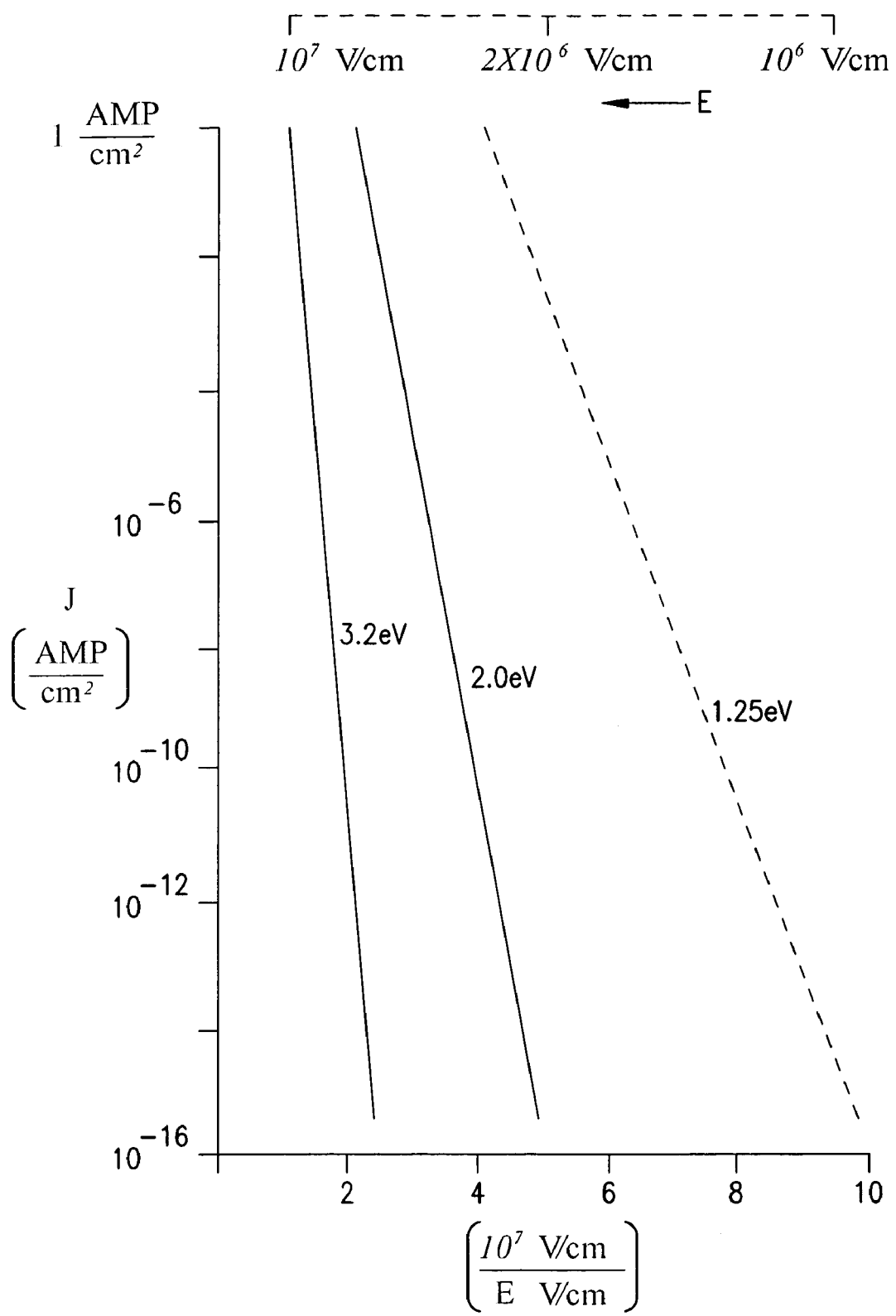
FIG. 7C is a graph plotting tunneling currents versus the applied electric fields (reciprocal applied electric field shown) for an number of barrier heights.

FIG. 7C is a graph plotting tunneling currents versus the applied electric fields (reciprocal applied electric field shown) for a number of barrier heights. FIG. 7C illustrates the dependence of the tunneling currents in the non-volatile memory component on electric field (reciprocal applied electric field) and barrier height. The fraction of voltage across the interpoly or intergate insulator, $\Delta V2$, can be increased by making the area of the intergate capacitor, C2, (e.g. intergate insulator 707) smaller than the area of the transistor gate capacitor, C1 (e.g. gate oxide 703).

Methods of Formation

Several examples are outlined below in order to illustrate how a diversity of such metal oxide tunnel barriers can be formed for the non-volatile memory component, according to the teachings of the present invention. Processing details and precise pathways taken which are not expressly set forth below will be obvious to one of ordinary skill in the art upon reading this disclosure. Firstly, although not included in the details below, it is important also to take into account the following processing factors in connection with the present invention:

(i) The poly-Si layer is to be formed with emphasis on obtaining a surface that is very smooth and morphologically stable at subsequent device processing temperatures which will exceed that used to grow Metal oxide.

(ii) The native SiO$_x$ oxide on the poly-Si surface must be removed (e.g., by sputter cleaning in an inert gas plasma in situ) just prior to depositing the metal film. The electrical characteristics of the resultant Poly-Si/Metal/Metal oxide/Metal/Poly-Si structure will be better defined and reproducible than that of a Poly-Si/Native SiO$_x$/Metal/Metal oxide/Poly-Si structure.

(iii) The oxide growth rate and limiting thickness will increase with oxidation temperature and oxygen pressure. The oxidation kinetics of a metal may, in some cases, depend on the crystallographic orientations of the very small grains of metal which comprise the metal film. If such effects are significant, the metal deposition process can be modified in order to increase its preferred orientation and subsequent oxide thickness and tunneling uniformity. To this end, use can be made of the fact that metal films strongly prefer to grow during their depositions having their lowest free energy planes parallel to the film surface. This preference varies with the crystal structure of the metal. For example, fcc metals prefer to form {111} surface plans. Metal orientation effects, if present, would be larger when only a limited fraction of the metal will be oxidized and unimportant when all or most of the metal is oxidized.

(iv) Modifications in the structure shown in FIG. 5 may be introduced in order to compensate for certain properties in some metal/oxide/metal layers. Such changes are reasonable since a wide range of metals, alloys and oxides with quite different physical and chemical properties can be used to form these tunnel junctions.

EXAMPLE I

Formation of PbO Tunnel Barriers

This oxide barrier has been studied in detail using Pb/PbO/Pb structures. The oxide itself can be grown very controllably on deposited lead films using either thermal oxidation or rf sputter etching in an oxygen plasma. It will be seen that there are a number of possible variations on this structure. Starting with a clean poly-Si substrate, one processing sequence using thermal oxidation involves:

(i) Depositing a clean lead film on the poly-Si floating gate at ~25 to 75 C in a clean vacuum system having a base pressure of ~$10^{-8}$ Torr or lower. The Pb film will be very thin with a thickness within 1 or 2 A of its target value.

(ii) Lead and other metal films can be deposited by various means including physical sputtering and/or from a Knudsen evaporation cell. The sputtering process also offers the ability to produce smoother films by increasing the re-sputtering-to-deposition ratio since re-sputtering preferentially reduces geometric high points of the film.

(iii) Using a "low temperature oxidation process" to grow an oxide film of self-limited thickness. In this case, oxygen gas is introduced at the desired pressure in order to oxidize the lead in situ without an intervening exposure to ambient air. For a fixed oxygen pressure and temperature, the PbO thickness increases with log(time). Its thickness can be controlled via time or other parameters to within 0.10 A, as determined via in situ ellipsometric or ex situ measurements of Josephson tunneling currents. This control is demonstrated by the very limited statistical scatter of the current PbO thickness data shown in the insert of FIG. 3. This remarkable degree of control over tunnel current is due to the excellent control over PbO thickness that can be achieved by "low temperature oxidation." For example, increasing the oxidation time from 100 to 1,000 minutes at an oxygen pressure of 750 Torr at 25 C only raises the PbO thickness by 3 A (e.g., from ~21 to 24 A). Accordingly, controlling the oxidation time to within 1 out of a nominal 100 minute total oxidation time provides a thickness that is within 0.1 A of 21 A. The PbO has a highly stoichiometric composition throughout its thickness, as evidenced from ellipsometry and the fact that the tunnel barrier heights are identical for Pb/PbO/Pb structures.

(iv) Re-evacuate the system and deposit the top lead electrode. This produces a tunnel structure having virtually identical tunnel barriers at both Pb/O interfaces.

(v) The temperature used to subsequently deposit the Poly-Si control gate must be held below the melting temperature (327 C) of lead. The PbO itself is stable (up to ~500 C or higher) and thus introduces no temperature constraint on subsequent processes. One may optionally oxidize the lead film to completion, thereby circumventing the low melting temperature of metallic lead. In this case, one would form a Poly-Si/PbO/Poly-Si tunnel structure having an altered tunnel barrier for charge injection. Yet another variation out of several would involve: oxidizing the lead film to completion; replacing the top lead electrode with a higher melting metal such as Al; and, then adding the poly-Si control layer. This junction would have asymmetrical tunneling behavior due to the difference in barrier heights between the Pb/PbO and PbO/Al electrodes.

EXAMPLE II

Formation of $Al_2O_3$ Tunnel Barriers

A number of studies have dealt with electron tunneling in $Al/Al_2O_3/Al$ structures where the oxide was grown by "low temperature oxidation" in either molecular or plasma oxygen. Before sketching out a processing sequence for these tunnel barriers, note:

(i) Capacitance and tunnel measurements indicate that the $Al_2O_3$ thickness increases with the log (oxidation time), similar to that found for PbO/Pb as well as a great many other oxide/metal systems.

(ii) Tunnel currents are asymmetrical in this system with somewhat larger currents flowing when electrons are injected from $Al/Al_2O_3$ interface developed during oxide growth. This asymmetry is due to a minor change in composition of the growing oxide: there is a small concentration of excess metal in the $Al_2O_3$, the concentration of which diminishes as the oxide is grown thicker. The excess $Al^{+3}$ ions produce a space charge that lowers the tunnel barrier at the inner interface. The oxide composition at the outer $Al_2O_3/Al$ contact is much more stoichiometric and thus has a higher tunnel barrier. In situ ellipsometer measurements on the thermal oxidation of Al films deposited and oxidized in situ support this model. In spite of this minor complication, $Al/Al_2O_3/Al$ tunnel barriers can be formed that will produce predictable and highly controllable tunnel currents that can be ejected from either electrode. The magnitude of the currents are still primarily dominated by $Al_2O_3$ thickness which can be controlled via the oxidation parametrics.

With this background, we can proceed to outline one process path out of several that can be used to form $Al_2O_3$ tunnel barriers. Here the aluminum is thermally oxidized although one could use other techniques such as plasma oxidation or rf sputtering in an oxygen plasma. For the sake of brevity, some details noted above will not be repeated. The formation of the $Al/Al_2O_3/Al$ structures will be seen to be simpler than that described for the Pb/PbO/Pb junctions owing to the much higher melting point of aluminum, relative to lead.

(i) Sputter deposit aluminum on poly-Si at a temperature of ~25 to 150 C. Due to thermodynamic forces, the microcrystallites of the f.c.c. aluminum will have a strong and desirable (111) preferred orientation.

(ii) Oxidize the aluminum in situ in molecular oxygen using temperatures, pressure and time to obtain the desired $Al_2O_3$ thickness. As with PbO, the thickness increases with log (time) and can be controlled via time at a fixed oxygen pressure and temperature to within 0.10 Angstroms, when averaged over a large number of aluminum grains that are present under the counter-electrode. One can readily change the $Al_2O_3$ thickness from ~15 to 35 A by using appropriate oxidation parametrics. The oxide will be amorphous and remain so until temperatures in excess of 400 C are reached. The initiation of recrystallization and grain growth can be suppressed, if desired, via the addition of small amounts of glass forming elements (e.g., Si) without altering the growth kinetics or barrier heights significantly.

(iii) Re-evacuate the system and deposit a second layer of aluminum.

(iv) Deposit the Poly-Si control gate layer using conventional processes.

EXAMPLE III

Formation of Single- and Multi-Layer Transition Metal Oxide Tunnel Barriers

Single layers of $Ta_2O_5$, $TiO_2$, $ZrO_2$, $Nb_2O_5$ and similar transition metal oxides can be formed by "low temperature oxidation" of numerous Transition Metal (e.g., TM oxides) films in molecular and plasma oxygen and also by rf sputtering in an oxygen plasma. The thermal oxidation kinetics of these metals have been studied for decades. In essence, such metals oxidize via logarithmic kinetics to reach thicknesses of a few to several tens of angstroms in the range of 100 to 300 C. Excellent oxide barriers for Josephson tunnel devices can be formed by rf sputter etching these metals in an oxygen plasma. Such "low temperature oxidation" approaches differ considerably from MOCVD processes used to produce these TM oxides. MOCVD films require high temperature oxidation treatments to remove carbon impurities, improve oxide stoichiometry and produce recrystallization. Such high temperature treatments also cause unwanted interactions between the oxide and the underlying silicon and thus have necessitated the introduction of interfacial barrier layers.

A new approach was described in a patent application by J. M. Eldridge, entitled "Thin Dielectric Films for DRAM Storage Capacitors," patent application Ser. No. 09/651,380 filed Aug. 29, 2000 (now U.S. Pat. No. 6,461,931 and assigned to Micron Technology, Inc.) that utilizes "low temperature oxidation" to form duplex layers of TM oxides. Unlike MOCVD films, the oxides are very pure and stoichiometric as formed. They do require at least a brief high temperature (est. 700 to 800 C but may be lower) treatment to transform their microstructures from amorphous to crystalline and thus increase their dielectric constants to the desired values (>20 or so). Unlike MOCVD oxides, this treatment can be carried out in an inert gas atmosphere, thus lessening the possibility of inadvertently oxidizing the poly-Si floating gate. While this earlier disclosure was directed at developing methods and procedures for producing high dielectric constant films for storage cells for DRAMs, the same teachings can be applied to producing thinner metal oxide tunnel films for the flash memory devices described in this disclosure. The dielectric constants of these TM oxides are substantially greater (>25 to 30 or more) than those of PbO and $Al_2O_3$. Duplex layers of these high dielectric constant oxide films are easily fabricated with simple tools and also provide improvement in device yields and reliability. Each oxide layer will contain some level of defects but the probability that such defects will overlap is exceedingly small. Effects of such duplex layers were first reported by J. M. Eldridge and are well known to practitioners of the art. It is worth mentioning that highly reproducible TM oxide tunnel barriers can be grown by rf sputtering in an oxygen ambient, as referenced above. Control over oxide thickness and other properties in these studies were all the more remarkable in view of the fact that the oxides were typically grown on thick (e.g., 5,000 A) metals such as Nb and Ta. In such metal-oxide systems, a range of layers and sub-oxides can also form, each having their own properties. In the present disclosure, control over the properties of the various TM oxides will be even better since we employ very limited (perhaps 10 to 100 A or so) thicknesses of metal and thereby preclude the formation of significant quantities of unwanted, less controllable sub-oxide films. Thermodynamic forces will drive the oxide compositions to their most stable, fully oxidized state, e.g., $Nb_2O_5$, $Ta_2O_5$, etc. As noted above, it will still be necessary to crystallize these duplex oxide layers. Such treatments can be done by RTP and will be shorter than those used on MOCVD and sputter-deposited oxides since the stoichiometry and purity of the "low temperature oxides" need not be adjusted at high temperature.

Fairly detailed descriptions for producing thicker duplex layers of TM oxides have been given in the copending application by J. M. Eldridge, entitled "Thin Dielectric Films for DRAM Storage Capacitors," patent application Ser. No. 09/651,380 filed Aug. 29, 2000, so there is no need to repeat them here. Although perhaps obvious to those skilled in the art, one can sketch out a few useful fabrication guides:

(i) Thinner TM layers will be used in this invention relative to those used to form DRAMs. Unlike DRAMs where leakage must be eliminated, the duplex oxides used here must be thin enough to carry very controlled levels of current flow when subjected to reasonable applied fields and times.

(ii) The TM and their oxides are highly refractory and etchable (e.g., by RIE). Hence they are quite compatible with poly-Si control gate processes and other subsequent steps.

(iii) TM silicide formation will not occur during the oxidation step. It could take place at a significant rate at the temperatures used to deposit the poly-Si control gate. If so, several solutions can be applied including:

(i) Insert certain metals at the TM/poly-Si boundaries that will prevent inter-diffusion of the TM and the poly-Si.

(ii) Completely oxide the TMs. The electrical characteristics of the resulting poly-Si/TM oxide 1/TM oxide 2/poly-Si structure will be different in the absence of having TM at the oxide/metal interfaces.

EXAMPLE IV

Formation of Alternate Metal Compound Tunnel Barriers

Although no applications may be immediately obvious, it is conceivable that one might want to form a stack of oxide films having quite different properties, for example, a stack comprised of a high dielectric constant (k) oxide/a low k oxide/a high k oxide. "Low temperature oxidation" can be used to form numerous variations of such structures. While most of this disclosure deals with the formation and use of stacks of oxide dielectrics, it is also possible to use "low temperature oxidation" to form other thin film dielectrics such as nitrides, oxynitrides, etc. that could provide additional functions such as being altered by monochromatic light, etc. These will not be discussed further here.

EXAMPLE V

Formation of Perovskite Oxide Tunnel Barriers

Some results have been obtained which demonstrate that at least a limited range of high temperature, super-conducting oxide films can be made by thermally oxidizing Y—Ba—Cu alloy films. The present inventors have also disclosed how to employ "low temperature oxidation" and short thermal treatments in an inert ambient at 700 C in order to form a range of perovskite oxide films from parent alloy films (see generally, J. M. Eldridge, "Low Cost Processes for Producing High Quality Perovskite Dielectric Films," U.S. patent application Ser. No. 09/651,380). The dielectric constants of crystallized, perovskite oxides can be very large, with values in the 100 to 1000 or more range. The basic process is more complicated than that needed to oxidize layered films of transition metals. (See Example III.) The TM layers would typically be pure metals although they could be alloyed. The TMs are similar metallurgically as are their oxides. In contrast, the parent alloy films that can be converted to a perovskite oxide are typically comprised of metals having widely different chemical reactivities with oxygen and other common gasses. In the Y—Ba—Cu system referenced above, Y and Ba are among the most reactive of metals while the reactivity of Cu approaches (albeit distantly) those of other noble metals. If the alloy is to be completely oxidized, then thin film barriers such as Pd, Pt, etc. or their conductive oxides must be added between the Si and the parent metal film to serve as: electrical contact layers; diffusion barriers; and, oxidation stops. In such a case, the Schottky barrier heights of various TM oxides and perovskite oxides in contact with various metals will help in the design of the tunnel device. In the more likely event that the perovskite parent alloy film will be only partially converted to oxide and then covered with a second layer of the parent alloy (recall the structure of FIG. 2), then the barrier heights will represent that developed during oxide growth at the parent perovskite alloy/perovskite oxide interface. Obviously, such barrier heights cannot be predicted ab initio for such a wide class of materials but will have to be developed as the need arises. This information will have to be developed on a system-by-system basis.

Methods of Operation

Write Operation

Write can be achieved by the normal channel hot electron injection and gate current through the silicon oxide to the floating gate. This is done by selecting a particular column by applying a high control gate voltage and applying relatively large drain voltage as is done with conventional ETOX flash memory devices. However, according to the teachings of the present invention, write can also be accomplished by applying a positive voltage to the substrate or well select line and a large negative voltage to the control gates, electrons will tunnel from the control gate to the floating gate. The low tunnel barrier provided by the intergate insulator will provide an easy write operation and the selection of the substrate or well bias will provide selectivity and address only one device.

Erase Operation

According to the teachings of the present invention, erase is achieved by providing a negative voltage to the substrate or well address line and a large positive voltage to the control gate. This causes electrons to tunnel off of the floating gate on to the control gate. A whole row can be erased by addressing all the column lines along that row and a block can be erased by addressing multiple row back gate or substrate/well address lines.

Read Operation

Read is accomplished as in conventional SRAM memory devices. A column line is addressed by applying a wordline voltage and sensing the current along the data bit or drain row address line.

System Level

Figure 8:
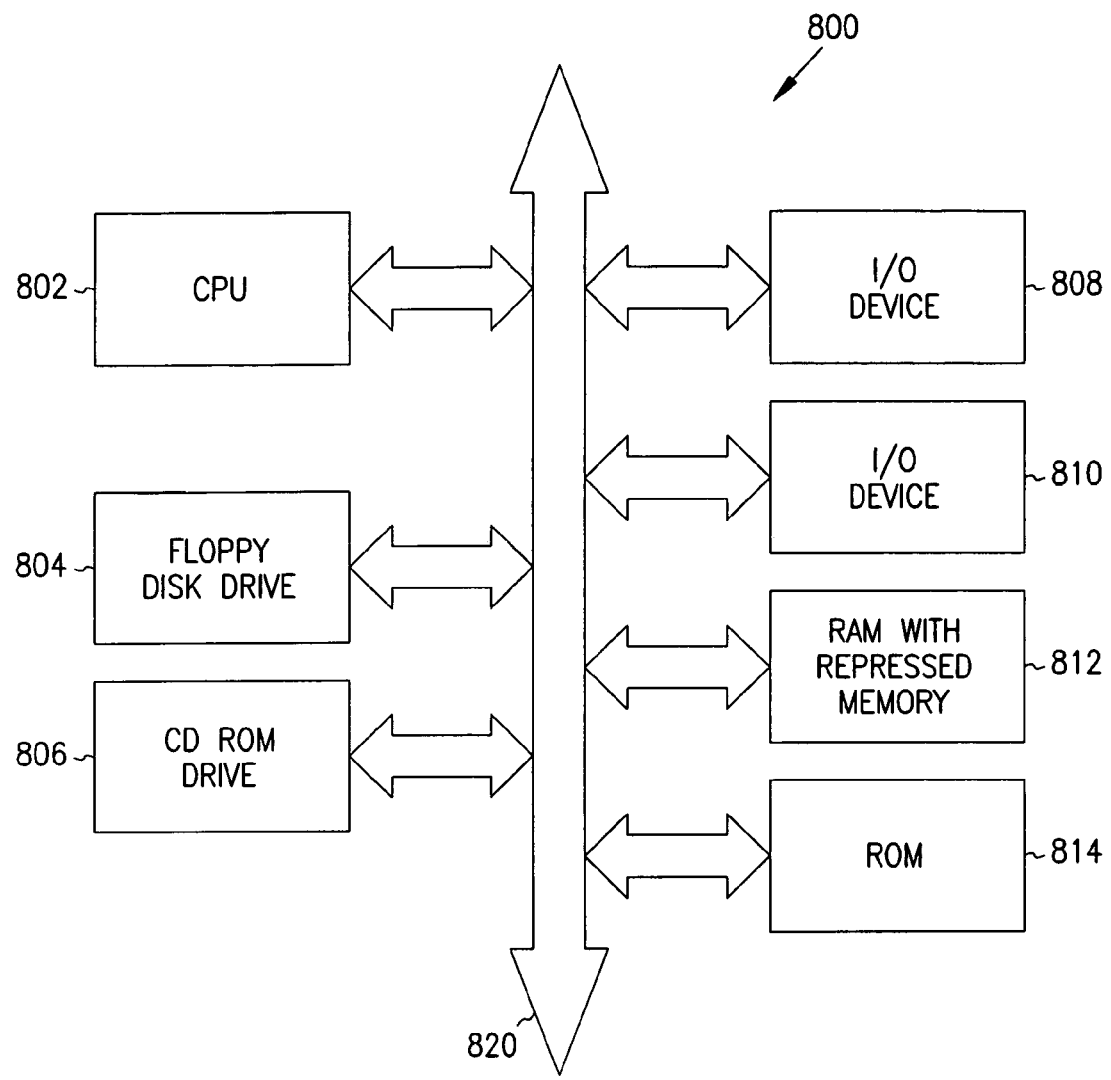
FIG. 8 illustrates a block diagram of a computer system utilizing the SRAM cells illustrated in FIGS. 5A, 5B and 5C.

FIG. 8 is a block diagram of a processor-based system 800 utilizing SRAM with repressed memory 812 constructed in accordance with the present invention. That is, the SRAM 812 utilizes the novel, non-volatile floating gate transistors 400 illustrated in FIG. 4. The processor-based system 800 may be a computer system, a process control system or any other system employing a processor and associated memory. The system 800 includes a central processing unit (CPU) 802, e.g., a microprocessor, that communicates with the SRAM 812 and an I/O device 808 over a bus 820. It must be noted that the bus 820 may be a series of buses and bridges commonly used in a processor-based system, but for convenience purposes only, the bus 820 has been illustrated as a single bus. A second I/O device 810 is illustrated, but is not necessary to practice the invention. The processor-based system 800 also includes read-only memory (ROM) 814 and may include peripheral devices such as a floppy disk drive 804 and a compact disk (CD) ROM drive 806 that also communicates with the CPU 802 over the bus 820 as is well known in the art.

It will be appreciated by those skilled in the art that additional circuitry and control signals can be provided, and that the system 800 has been simplified to help focus on the invention. At least one of the SRAM cells in SRAM 812 has a novel, non-volatile floating gate transistor formed according to the embodiments of the present invention. That is, at least one SRAM cell includes a non-volatile floating gate transistor having a low tunnel barrier interpoly insulator separating the control gate from the floating gate and which is programmable according to the teachings of the present invention.

It will be understood that the embodiment shown in FIG. 8 illustrates an embodiment for electronic system circuitry in which the novel memory cells of the present invention are used. The illustration of system 800, as shown in FIG. 8, is intended to provide a general understanding of one application for the structure and circuitry of the present invention, and is not intended to serve as a complete description of all the elements and features of an electronic system using the novel memory cell structures. Further, the invention is equally applicable to any size and type of SRAM device 812 which has SRAM cells using the novel floating gate transistors of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

The above structures and fabrication methods have been described, by way of example, and not by way of limitation, with respect to SRAM systems and devices having a novel, non-volatile floating gate transistor within the cell. SRAM cells and memory devices are provided where at least one of the transistors in the cross coupled cell includes a novel floating gate transistor, e.g. a non-volatile memory component, which can be programmed to provide the SRAM cell with a definitive asymmetry so that the cell always starts in a particular state. In this manner, the cell can be used both stand alone SRAM and for embedded SRAM in combination with a microcontroller. According to the teachings of the present invention, the non-volatile component includes a floating gate separated from a control gate by a metal oxide and/or low tunnel barrier interpoly insulator. The present invention, describes the use of a cross coupled SRAM cell where at least one of the transistors in the cross coupled cell includes a novel floating gate transistor, e.g. non-volatile memory component as described below, which can be programmed to provide the SRAM cell with a definitive asymmetry so that the cell always starts in a particular state. In this manner, the cell can be used both stand alone SRAM and for embedded SRAM in combination with a microcontroller. The typical application would, in fact, want to be user field or in service programmable with different nonvolatile data patterns stored for each user. One usage for the present invention is to replace a boot ROM, but other applications could be to store data that can be updated or over written later. In other words the cell can be programmed to always start with either a "zero" or "one" stored in the cell and the information used for start-up instructions. This built in asymmetry has no effect upon normal operation of the cell as an SRAM. In these cases large asymmetries are written into the cell by programming it by holding either node voltage, V1, or V2, at ground or a low voltage.

It has been shown that the low tunnel barrier interpoly insulators of the present invention avoid the large barriers to electron tunneling or hot electron injection presented by the silicon oxide-silicon interface, 3.2 eV, which result in slow write and erase speeds even at very high electric fields. The present invention also avoids the combination of very high electric fields and damage by hot electron collisions in the which oxide result in a number of operational problems like soft erase error, reliability problems of premature oxide breakdown and a limited number of cycles of write and erase. Further, the low tunnel barrier interpoly dielectric insulator erase approach, of the present invention remedies the above mentioned problems of having a rough top surface on the polysilicon floating gate which results in, poor quality interpoly oxides, sharp points, localized high electric fields, premature breakdown and reliability problems.

What is claimed is:

1. A six transistor SRAM cell, comprising:
   a pair of cross coupled inverters, wherein each inverter includes an NMOS transistor and a PMOS transistor, and wherein at least one of the PMOS transistors includes:
      a first source/drain region and a second source/drain region separated by a channel region in a substrate;
      a floating gate opposing the channel region and separated therefrom by a gate oxide; and
      a control gate opposing the floating gate, wherein the control gate is separated from the floating gate by a low tunnel barrier intergate insulator;
   a pair of bitlines coupled to the pair of cross inverters at a pair of voltage nodes;
   wherein the floating gate is adapted to be programmed with a respective charge state such that the SRAM cell has a definitive asymmetry; and
   wherein the low tunnel barrier intergate insulator includes a metal layer in contact with one of the floating gate and the control gate.

2. The memory cell of claim 1, wherein the metal layer includes lead and the intergate insulator is lead oxide (PbO).

3. The memory cell of claim 1, wherein the metal layer includes aluminum and the intergate insulator is aluminum oxide ($Al_2O_3$).

4. The memory cell of claim 1, wherein the metal layer includes a transition metal layer and the intergate insulator includes a transition metal oxide intergate insulator.

5. The memory cell of claim 4, wherein the transition metal oxide intergate insulator includes $Ta_2O_5$.

6. The memory cell of claim 4, wherein the transition metal oxide intergate insulator includes $TiO_2$.

7. The memory cell of claim 4, wherein the transition metal oxide intergate insulator includes $ZrO_2$.

8. The memory cell of claim 4, wherein the transition metal oxide intergate insulator includes $Nb_2O_5$.

9. The memory cell of claim 1, wherein the intergate insulator includes a Perovskite oxide intergate insulator.

10. An array of memory cells, comprising:
    a number of SRAM cells, wherein the number of SRAM cells each include a pair of cross coupled inverters, wherein each inverter includes an NMOS transistor and a PMOS transistor, and wherein at least one of the PMOS transistors includes:
       a first source/drain region and a second source/drain region separated by a channel region in a substrate;
       a floating gate opposing the channel region and separated therefrom by a gate oxide; and
       a control gate opposing the floating gate, wherein the control gate is separated from the floating gate by a low tunnel barrier intergate insulator, and wherein the low tunnel barrier intergate insulator includes a metal layer in contact with one of the floating gate and the control gate;
    a pair of bitlines coupled to the pair of cross inverters at a pair of voltage nodes;
    a wordline coupled to the pair of access transistors; and
    wherein the floating gate is adapted to be programmed with a respective charge state such that the SRAM cell has a definitive asymmetry.

11. The array of memory cells of claim 10, wherein the low tunnel barrier intergate insulator includes a metal oxide insulator PbO.

12. The array of memory cells of claim 10, wherein the low tunnel barrier intergate insulator includes a metal oxide insulator $Al_2O_3$.

13. The array of memory cells of claim 10, wherein the low tunnel barrier intergate insulator includes a metal oxide insulator $Ta_2O_5$.

14. The array of memory cells of claim 10, wherein the low tunnel barrier intergate insulator includes a metal oxide insulator $TiO_2$.

15. The array of memory cells of claim 10, wherein the low tunnel barrier intergate insulator includes a metal oxide insulator $ZrO_2$.

16. The array of memory cells of claim 10, wherein the low tunnel barrier intergate insulator includes a metal oxide insulator $Nb_2O_5$.

17. An array of six transistor SRAM cells, comprising:
    a number of SRAM cells, wherein the number of SRAM cells each include a pair of cross coupled inverters, wherein each inverter includes an NMOS transistor and a PMOS transistor, and wherein at least one of the PMOS transistors includes:
       a first source/drain region and a second source/drain region separated by a channel region in a substrate;
       a floating gate opposing the channel region and separated therefrom by a gate oxide; and
       a control gate opposing the floating gate, wherein the control gate is separated from the floating gate by a low tunnel barrier intergate insulator, and wherein the low tunnel barrier intergate insulator includes a metal layer in contact with one of the floating gate and the control gate;
    a pair of bitlines coupled to the pair of cross inverters at a pair of voltage nodes;
    a wordline coupled to the pair of access transistors; and
    wherein the floating gate is adapted to be programmed with a respective charge state such that the SRAM cell has a definitive asymmetry.

18. The array of memory cells of claim 17, wherein the low tunnel barrier intergate insulator includes a metal oxide insulator PbO.

19. The array of memory cells of claim 17, wherein the low tunnel barrier intergate insulator includes a metal oxide insulator $Al_2O_3$.

20. The array of memory cells of claim 17, wherein the low tunnel barrier intergate insulator includes a metal oxide insulator $Ta_2O_5$.

21. The array of memory cells of claim 17, wherein the low tunnel barrier intergate insulator includes a metal oxide insulator $TiO_2$.

22. The array of memory cells of claim 17, wherein the low tunnel barrier intergate insulator includes a metal oxide insulator $ZrO_2$.

23. The array of memory cells of claim 17, wherein the low tunnel barrier intergate insulator includes a metal oxide insulator $Nb_2O_5$.

24. A six transistor SRAM cell, comprising:
a pair of cross coupled inverters, wherein each inverter includes an NMOS transistor and a PMOS transistor, and wherein at least one of the PMOS transistors includes:
a first source/drain region and a second source/drain region separated by a channel region in a substrate;
a floating gate opposing the channel region and separated therefrom by a gate oxide; and
a control gate opposing the floating gate, wherein the control gate is separated from the floating gate by a low tunnel barrier intergate insulator;
a pair of bitlines coupled to the pair of cross inverters at a pair of voltage nodes;
wherein the floating gate is adapted to be programmed with a respective charge state such that the SRAM cell has a definitive asymmetry; and
wherein the floating gate includes a polysilicon floating gate having a metal layer formed thereon in contact with the low tunnel barrier intergate insulator.

25. The memory cell of claim 24, wherein the low tunnel barrier intergate insulator includes a metal oxide insulator selected from the group consisting of PbO, $Al_2O_3$, $Ta_2O_5$, $TiO_2$, $ZrO_2$, and $Nb_2O_5$.

26. A six transistor SRAM cell, comprising:
a pair of cross coupled inverters, wherein each inverter includes an NMOS transistor and a PMOS transistor, and wherein at least one of the PMOS transistors includes:
a first source/drain region and a second source/drain region separated by a channel region in a substrate;
a floating gate opposing the channel region and separated therefrom by a gate oxide; and
a control gate opposing the floating gate, wherein the control gate is separated from the floating gate by a low tunnel barrier intergate insulator;
a pair of bitlines coupled to the pair of cross inverters at a pair of voltage nodes; and
wherein the floating gate is adapted to be programmed with a respective charge state such that the SRAM cell has a definitive asymmetry;
wherein the control gate includes a polysilicon control gate having a metal layer formed thereon in contact with the low tunnel barrier intergate insulator.

27. The memory cell of claim 26, wherein the low tunnel barrier intergate insulator includes a metal oxide insulator selected from the group consisting of PbO, $Al_2O_3$, $Ta_2O_5$, $TiO_2$, $ZrO_2$, and $Nb_2O_5$.

28. A semiconductor structure, comprising:
a pair of cross coupled inverters, wherein each inverter includes an NMOS transistor and a PMOS transistor, and wherein at least one of the NMOS transistors includes:
a first source/drain region and a second source/drain region separated by a channel region in a substance;
a floating gate opposing the channel region and separated therefrom by a gate oxide; and
a polysilicon control gate having metal disposed thereon that opposes the floating gate, wherein the control gate is separated from the floating gate by a low tunnel barrier intergate insulator, and wherein the low tunnel barrier intergate insulator includes a metal oxide insulator selected from the group consisting of lead oxide (PbO) and aluminum oxide ($Al_2O_3$), and wherein the low tunnel barrier intergate insulator includes a further transition metal oxide; and
a pair of bitlines coupled to the pair of cross inverters at a pair of voltage nodes.

29. The semiconductor structure of claim 28, wherein the floating gate is adapted to be programmed with a charge such that the structure has a definitive asymmetry and a definitive state upon startup.

30. The semiconductor structure of claim 28, wherein the further transition metal oxide is selected from the group consisting of $Ta_2O_5$, $TiO_2$, $ZrO_2$, and $Nb_2O_5$.

31. The semiconductor structure of claim 28, wherein the low tunnel barrier intergate insulator includes a Perovskite oxide tunnel barrier.

32. A semiconductor structure, comprising:
a pair of cross coupled inverters, wherein each inverter includes an NMOS transistor and a PMOS transistor, and wherein at least one of the NMOS transistors includes:
a first source/drain region and a second source/drain region separated by a channel region in a substance;
a floating gate opposing the channel region and separated therefrom by a gate oxide, wherein the floating gate includes a polysilicon floating gate having a metal layer formed thereon in contact with the low tunnel barrier intergate insulator; and
a control gate opposing the floating gate, wherein the control gate is separated from the floating gate by a low tunnel barrier intergate insulator, wherein the control gate includes a polysilicon control gate having a metal layer formed thereon in contact with the low tunnel barriel intergate insulator; and
a pair of bitlines coupled to the pair of cross inverters at a pair of voltage nodes.

33. The semiconductor structure of claim 32, wherein the floating gate is adapted to be programmed with a charge such that the struture has a definitive asymmetry and a definitive state upon startup.

34. The semiconductor structure of claim 32, wherein the low tunnel barrier intergate insulator includes a metal oxide insulator selected from the group consisting of PbO, $Al_2O_3$, $Ta_2O_5$, $TiO_2$, $ZrO_2$, and $Nb_2O_5$.

35. The semiconductor structure of claim 32, wherein the low tunnel barrier intergate insulator includes a Perovskite oxide tunnel barrier.

36. A semiconductor structure, comprising:
a pair of cross coupled inverters, wherein each inverter includes an NMOS transistor and a PMOS transistor, and wherein at least one of the NMOS transistors includes:
a first source/drain region and a second source/drain region separated by a channel region in a substrate;
a floating gate opposing the channel region and separated therefrom by a gate oxide; and
a control gate opposing the floating gate, wherein the control gate is separated from the floating gate by a low tunnel barrier intergate insulator, wherein the control gate includes a polysilicon control gate having a metal layer formed thereon in
contact with the low tunnel barrier intergate insulator; and
a pair of bitlines coupled to the pair of cross inverters at a pair of voltage nodes.

37. The semiconductor structure of claim 36, wherein the floating gate is adapted to be programmed with a charge such that the memory cell has a definitive asymmetry and a definitive state upon startup.

38. The semiconductor structure of claim 36, wherein the low tunnel barrier intergate insulator includes a metal oxide insulator selected from the group consisting of $PbO$, $Al_2O_3$, $Ta_2O_5$, $TiO_2$, $ZrO_2$, and $Nb_2O_5$.

39. The semiconductor structure of claim 36, wherein the low tunnel barrier intergate insulator includes a Perovskite oxide tunnel barrier.

* * * * *

UNITED STATES PATENT AND TRADEMARK OFFICE
CERTIFICATE OF CORRECTION

| | |
|---|---|
| PATENT NO. | : 7,443,715 B2 |
| APPLICATION NO. | : 11/062543 |
| DATED | : October 28, 2008 |
| INVENTOR(S) | : Forbes |

It is certified that error appears in the above-identified patent and that said Letters Patent is hereby corrected as shown below:

In column 23, line 64, in Claim 28, after "having" insert -- a --.

In column 23, line 64, in Claim 28, after "metal" insert -- layer --.

In column 23, line 67, in Claim 28, delete "insulator," and insert -- insulator --, therefor.

In column 24, line 35, in Claim 32, delete "barriel" and insert -- barrier --, therefor.

In column 24, line 40, in Claim 33, delete "struture" and insert -- structure --, therefor.

Signed and Sealed this

Third Day of March, 2009

JOHN DOLL
*Acting Director of the United States Patent and Trademark Office*